(12) United States Patent
Tsukamoto

(10) Patent No.: US 6,587,984 B1
(45) Date of Patent: Jul. 1, 2003

(54) DISTORTION DETECTING DEVICE, DISTORTION CORRECTING DEVICE, AND DISTORTION CORRECTING METHOD FOR DIGITAL AUDIO SIGNAL

(75) Inventor: Masaki Tsukamoto, Mitaka (JP)

(73) Assignee: Nippon Columbia Co., Ltd., Tokyo (JP)

( * ) Notice: Subject to any disclaimer, the term of this patent is extended or adjusted under 35 U.S.C. 154(b) by 0 days.

(21) Appl. No.: 09/381,202

(22) PCT Filed: Jan. 9, 1998

(86) PCT No.: PCT/JP98/00053

§ 371 (c)(1),
(2), (4) Date: Sep. 17, 1999

(87) PCT Pub. No.: WO98/42077

PCT Pub. Date: Sep. 24, 1998

(30) Foreign Application Priority Data

Mar. 18, 1997 (JP) ............................................. 9-084483

(51) Int. Cl.[7] ................................................. H04L 1/00

(52) U.S. Cl. .......................... 714/746; 341/155; 341/51

(58) Field of Search .......................... 360/48, 72.2, 137, 360/69, 71, 32, 8; 341/144, 56, 69, 155, 50, 51, 131; 369/30, 18; 710/240; 700/94; 704/205, 211, 270; 714/752, 746; 375/216, 316, 344, 286; 386/2, 20, 104, 100, 96; 348/497; 455/182, 2

(56) References Cited

U.S. PATENT DOCUMENTS

| 4,430,736 A | | 2/1984 | Scholz | |
|---|---|---|---|---|
| 5,095,509 A | * | 3/1992 | Volk | ........................... 381/111 |
| 5,191,618 A | * | 3/1993 | Hisey | ........................ 381/158 |
| 5,414,686 A | * | 5/1995 | Iitsuka | ........................ 369/48 |
| 5,459,621 A | * | 10/1995 | Tsuji et al. | ................... 360/32 |
| 5,500,842 A | | 3/1996 | Dunlavy | |

(List continued on next page.)

FOREIGN PATENT DOCUMENTS

| DE | 4125717 C1 | | 2/1993 | ............ H03M/1/10 |
|---|---|---|---|---|
| JP | 408223039 A | * | 8/1919 | |
| JP | 3-80621 | | 4/1991 | |
| JP | 4-75176 | | 3/1992 | |
| JP | 4-361428 | | 12/1992 | |

OTHER PUBLICATIONS

Knecht et al. (Neural network filters for speech enhancement; IEEE; On pp: 433 –438; Nov. 1995).*
Stuart (High quality digital audio; IEEE; on pp: 111 –112; 1991).*
Lee, Hae–Seung, "A 120b 600ks/s Digitally Self–Calibrated Pipeline Algorithmic ADC," IEEE Journal of Solid–State Circuits, 29 (1994) Apr., No. 4 , pp. 509–515.

*Primary Examiner*—Albert Decady
*Assistant Examiner*—Guy Lamarre
(74) *Attorney, Agent, or Firm*—Dickstein Shapiro Morin & Oshinsky LLP

(57) ABSTRACT

A digital audio signal distortion detecting device is provided for estimating the distortion based on the linearity error of an analog/digital converter at the time of analog/digital conversion from a digital audio signal converted from analog to digital by the analog/digital conversion having linearity error. This device includes storage means (2) for storing the digital audio signal, occurrence frequency detecting means (3) for fetching a plurality of samples from the digital audio signal stored in the storage means (2) and counting the occurrence frequency of the samples for every code expressing the quantization level of the samples, normalizing means (4) for extracting distortion characteristics accompanying the linearity error of an A/D converter (11) from the occurrence frequency for every code detected by the occurrence frequency detecting means (3) as a normalized occurrence frequency, and error bit detecting means (5) for detecting an error bit on the basis of the code corresponding to the characteristics of the normalized occurrence frequency.

3 Claims, 23 Drawing Sheets

U.S. PATENT DOCUMENTS 5,577,044 A * 11/1996 Oxford ...................... 370/522
5,594,601 A * 1/1997 Mimick et al. ............ 360/72.2
5,721,783 A * 2/1998 Anderson ................... 381/328
5,946,355 A * 8/1999 Baker .......................... 341/56

* cited by examiner

DISTORTION DETECTING DEVICE, DISTORTION CORRECTING DEVICE, AND DISTORTION CORRECTING METHOD FOR DIGITAL AUDIO SIGNAL

TECHNICAL FIELD

The present invention relates to a distortion detecting device, a distortion correcting device, and a distortion correcting method for detecting the generated distortion accompanying the linearity error (conversion error) of an analog/digital converter when an analog audio signal is converted to a digital audio signal through analog-digital conversion by the analog/digital converter.

BACKGROUND ART

Heretofore, analog/digital converters (A/D converters) contained linearity error in accordance with the A/D conversion precision. When the A/D converter converts an analog signal to a digital signal, distortion is generated accompanying the linearity error (hereinafter referred to as "conversion error") of the A/D converter in the converted digital audio signal. In this case, when performing A/D conversion with the A/D converter, it is possible to reduce to a certain degree the distortion based on the conversion error at the time of A/D conversion by adjusting the internal resistance of the A/D converter or adjusting the bit weighting with an external circuit.

However, a great number of music software titles, which were digitally recorded in the past using A/D conversion (digital audio signals recorded in the past), were converted from analog to digital by A/D converters having poor conversion precision at a low number of bits (such as 13 bits or 14 bits). Consequently, the A/D converters themselves contained conversion errors even if adjusted (and contained considerable distortion based on the conversion error compared to modern (such as 16-bit) A/D converters) and the distortion accompanying the conversion error due to poor conversion precision becomes one cause of degraded quality of the recorded music signal. Therefore, it is presently preferable to obtain digital audio signals having reduced distortion based on the conversion error of the A/D converters that were used in the past at the time of the recording.

In this case, it is possible to measure the characteristics of the A/D converters that were used in the past at the time of the recording and to correct the A/D conversion error based on these characteristics. However, since the characteristics of A/D converters deteriorate with time, the characteristics at the time of A/D conversion, namely, the conversion error, cannot be detected accurately from the A/D converters that were used at the time of the A/D conversion. Furthermore, 13-bit or 14-bit A/D converters that were used at the time of recording generally do not presently exist. In this case, the characteristics of the A/D converters cannot be detected from the A/D converters. It is thus difficult to accurately detect the A/D conversion error of the digital audio signals regardless of whether or not the 13-bit or 14-bit A/D converters that were used in the past at the time of the recording are currently available, and resulted in a problem where the A/D conversion error could not be reduced.

It was also difficult to estimate (detect) the conversion error at the time of A/D conversion from the digital audio signal that was recorded with distortion based on the conversion error (pre-recorded music signal). A known measurement device using a sine wave histogram method estimates (detects) the conversion error of the A/D conversion from the digital audio signal. After a distortion-free sine wave is fed to an A/D converter to be measured, a histogram is obtained and the measurement device uses the histogram to measure the conversion error that is to be measured. However, if the signal source, such as a digital audio signal, is not a sine wave, the conversion error could not be estimated (detected).

In this manner, it was difficult hitherto to estimate (detect) the conversion error at the time A/D conversion from the digital audio signal (music signal), which was already recorded using A/D conversion, and therefore, a digital audio signal with reduced distortion based on the conversion error at the time of A/D conversion could not be obtained.

It is therefore an object of the present invention to provide a distortion detecting device, a distortion correcting device, and a distortion correcting method for making it possible to correct the digital audio signal so as to reduce the distortion included in the digital audio signal by estimating (detecting) the distortion based on the linearity error of the A/D converter at the time of A/D conversion from the digital audio signal (pre-recorded music signal) that was converted from analog to digital by the A/D converter having linearity error.

DISCLOSURE OF THE INVENTION

The distortion detecting device for digital audio signal relating to the present invention comprises storage means for storing a digital audio signal, occurrence frequency detecting means for extracting a plurality of samples from the digital audio signal stored in the storage means and counting the occurrence frequency of the sample for every code expressing a quantization level of the sample, normalizing means for extracting a distortion characteristic accompanying the linearity error of an analog/digital converter as a normalized occurrence frequency from the occurrence frequency for every code detected by the occurrence frequency detecting means, and error bit detecting means for detecting an error bit from a difference between codes of the normalized occurrence frequency extracted by the normalizing means.

According to the present invention, even though the analog/digital converter that generated the digital audio signal including conversion error does not exist, the distortion based on the linearity error of the analog/digital converter can be detected on the basis of the generated digital audio signal.

The distortion correcting device for digital audio signal relating to the present invention comprises conversion error detecting means for detecting the error bit influenced by the linearity error of the analog/digital converter from the occurrence frequency for every code of the digital audio signal converted to code by the analog/digital converter, and conversion error correcting means for correcting the error bit of the digital audio signal based on a detection result from the conversion error detecting means.

According to the present invention, the bit at which the distortion accompanying the linearity error of the analog/digital converter is generated is detected, and based on this detection result, the bit concerning the distortion is corrected so that the distortion of the digital audio signal generated including conversion error can be reduced.

In the distortion correcting device for digital audio signal relating to the present invention, the conversion error detecting means comprise the storage means for storing the digital audio signal, the occurrence frequency detecting means for extracting a plurality of samples from the digital audio signal stored in the storage means and counting the occurrence frequency of the sample for every code expressing a quantization level of the sample, the normalizing means for extracting the distortion characteristic accompanying the linearity error of the analog/digital converter as normalized occurrence frequency from the occurrence frequency for every code detected by the occurrence frequency detecting means, and the error bit detecting means for detecting the error bit based on the code corresponding to a feature of the normalized occurrence frequency.

According to the present invention, the normalization of the occurrence frequency causes the feature dependent on the digital audio signal for which samples were collected to be removed and the conversion characteristic of the analog/digital converter at the time of generating the digital audio signal to be extracted. Thus, the distortion correcting device according to the present invention can correct an arbitrary digital audio signal generated with the same conversion characteristic as the analog/digital converter.

In the distortion correcting device for digital audio signal relating to the present invention, the occurrence frequency detecting means comprise a histogram memory using as an address the code according to the quantization level, read data in the histogram memory at the address corresponding to the code of the sample read from the storage means and add 1, write added data to the histogram memory, and create a histogram expressing the occurrence frequency for every code.

In the distortion correcting device for digital audio signal relating to the present invention, the normalizing means obtain an average occurrence frequency, which averages the occurrence frequency for every block formed from a plurality of codes respectively corresponding to a plurality of adjacent quantization levels, divide the occurrence frequency corresponding to every code by the average occurrence frequency of the block including the concerned codes, and set a value of the division result as the normalized occurrence frequency.

In the distortion correcting device for digital audio signal relating to the present invention, the error bit detecting means obtain an interval of the quantization level according to a varying pattern of the normalized occurrence frequency appearing in correspondence to the quantization level series, and detect the error bit according to the concerned interval.

In the distortion correcting device for digital audio signal relating to the present invention, the conversion error correcting means estimate the correct code on the basis of the error bit detected by the conversion error detecting means, and replace the code of the digital audio signal that was input with an estimate of the correct code.

In the distortion correcting device for digital audio signal relating to the present invention, the estimation of the correct code in the conversion error correcting means is performed by setting to X the average of the normalized occurrence frequency corresponding to every code having the error bit, obtaining a first difference $D_1$, when the same value of the digital audio signal continues in a plurality of $K_t$ samples from time $K_1$ to $K_t$, between the first sample value of the same value in succession and the value of the preceding sample, obtaining a second difference $D_2$ between the last sample value of the same value in succession and the value of the succeeding sample, and adding 1 to values from $K_{t/X}$ to $K_t$ of the plurality of samples when the first difference $D_1$ and second difference $D_2$ are positive values or adding 1 to values from $K_1$ to $K_{t(1-1/X)}$ of the plurality of samples when the first difference $D_1$ and second difference $D_2$ are negative values.

The distortion correcting device for digital audio signal relating to the present invention comprise the storage means for storing the digital audio signal converted to code by the analog/digital converter, the occurrence frequency detecting means for extracting a plurality of samples from the digital audio signal stored in the storage means and counting the occurrence frequency of the samples for every code expressing the quantization level of the samples to obtain a level distribution, the normalizing means for generating, by applying a low-pass filtering process on the original level distribution detected by the occurrence frequency detecting means, an ideal level distribution approximating an ideal case where the analog/digital converter has no error, dividing the original level distribution by the ideal level distribution, and setting the divided result thereof as a normalized level distribution, the conversion table calculating means for calculating a conversion table for all of the quantization levels of the digital audio signal based on the normalized level distribution, and the data substituting means for substituting the quantization level of the digital audio signal with the level data according to the conversion table for output.

According to the present invention, the conversion error of the analog/digital converter is estimated from the level distribution of the digital audio signal recorded using the analog/digital converter that is used, the conversion table for all of the quantization levels of the digital audio signal; and is calculated based on the estimated conversion error, the conversion process is performed on the digital audio signal using the table, and the distortion generated due to the conversion error of the analog/digital converter is corrected so that the unevenness in the occurrence frequency is corrected at or below the threshold and the A/D conversion error can be substantially reduced.

The distortion correcting method for digital audio signal relating to the present invention corrects the distortion generated due to the conversion error of the analog/digital converter by estimating the conversion error of the analog digital converter that is used, from the level distribution of the digital audio signal recorded using the analog/digital converter, calculating the conversion table for all of the quantization levels of the digital audio signal based on the estimated conversion error, and performing a conversion process using the conversion table on the digital audio signal.

In the distortion correcting method for digital audio signal relating to the present invention, the conversion table is created by collecting a predetermined number of samples from the digital audio signal recorded using the analog/digital converter to obtain the level distribution of the concerned samples, applying the low-pass filtering process on the level distribution to generate an ideal level distribution approximating an ideal case where the analog/digital converter has no error, dividing the level distribution, before the low-pass filtering process was applied, by the ideal level distribution, to set the divided result thereof as a normalized level distribution, carrying out accumulation based on the normalized level distribution to calculate a conversion table for all of said quantization levels of die digital audio signal, and substituting the quantization level of the digital audio signal with level data according to the conversion table for output.

According to the above-mentioned present invention, the error of the analog/digital converter can be detected from the recorded digital audio signal even though the characteristic of the analog/digital converter used in the generation of the digital audio signal is unknown or the analog/digital converter itself is unavailable, and furthermore, the distortion of the digital audio signal can be corrected on the basis of the error of detected analog/digital converter and the distortion of the digital audio signal can be reduced to improve the audio quality.

On the other hand, in another distortion correcting method for the digital audio signal relating to the present invention, a linear count-up signal is input to the analog/digital converter, the conversion error of the analog/digital converter is calculated by comparing the input signal of the analog/digital converter with the output signal thereof, and on the basis of the above calculated conversion error, the distortion based on the conversion error included in an arbitrary output signal from the analog/digital converter is corrected according to the conversion error calculated in the above-mentioned manner.

According to the present invention, if the A/D converter used when recording the music source presently exists without changes in its conversion characteristics, a music signal currently recorded in 16 bits, for example, can be converted in the future into a music signal having 24 bits or more.

BEST MODE(S) FOR CARRYING OUT THE INVENTION

Figure 1:
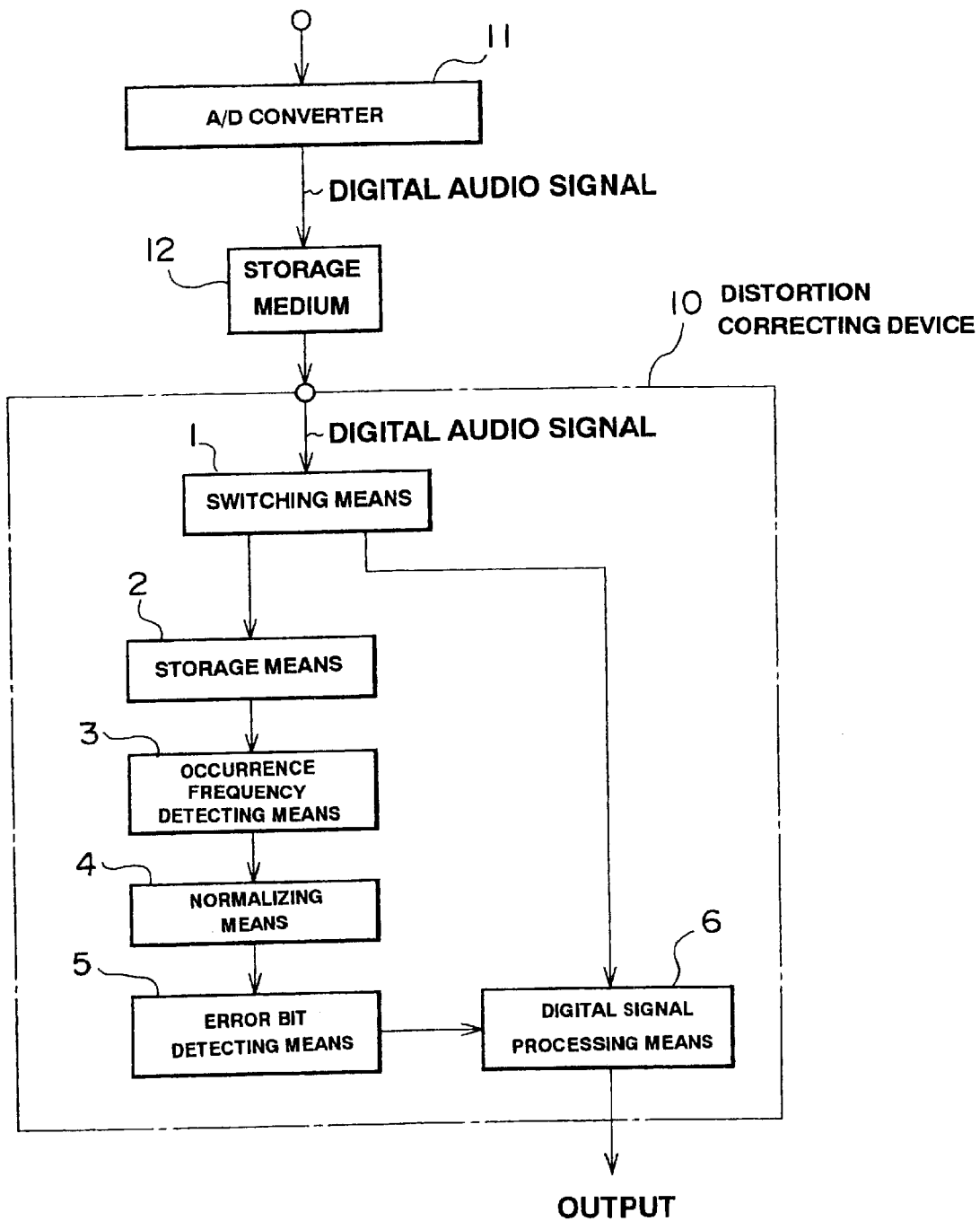
FIG. 1 is a block diagram showing an example configuration of a distortion correcting device relating to the present invention.

Embodiments of the present invention will be described with reference to the drawings. FIG. 1 is a block diagram showing an example configuration of the distortion correcting device relating to the present invention.

In FIG. 1, a storage medium 12, such as a digital audio tape (DAT) or a compact disc (CD), is recorded with a digital audio signal that was generated by an A/D converter 11 through A/D conversion from an analog audio signal.

A distortion correcting device 10 is designed to read the digital audio signal recorded on the storage medium 12, and on the basis of the digital audio signal, reduce the distortion accompanying the conversion error at the time of A/D conversion. Thus, the distortion correcting device 10 comprises switching means 1 for switching the destination of he output of the digital audio signal that was converted to a ode by the A/D converter 11, storage means 2 for storing the digital audio signal that is input from the switching means 1, occurrence frequency detecting means 3 for reading the digital audio signal from the storage means 2, obtaining a plurality of samples, and counting the occurrence frequency of the samples for every code expressing the quantization levels of the samples, normalizing means 4 for normalizing the occurrence frequency for every code detected by the occurrence frequency detecting means 3 and determining the occurrence frequency expressing the distortion based on the linearity error of the A/D converter 11, error bit detecting means 5 for detecting the error bit from the code of normalized occurrence frequency that was obtained by the normalizing means 4, and digital signal processing means 6 for correcting and outputting the error bit that was detected by the error bit detecting means 5 for the digital audio signal that was input from the switching means 1.

More specifically, the switching means 1 may be a switch, for example, for reading the digital audio signal from the storage medium 12 via a digital audio interface. The switching means 1 switch the destination of the output of the digital audio signal so that the digital audio signal that was read is supplied either to the storage means 2, such as a hard disk, or to the digital signal processing means 6 to be described later. As will be described in an example hereinafter, the switching means 1, for example, initially supply the digital audio signal that was read from the storage medium 12 to the storage means 2. Then, after the storage means 2, occurrence frequency detecting means 3, normalizing means 4, and error bit detecting means 5 detect the error bit included in the digital audio signal, the switching means 1 again read the digital audio signal from the storage medium 12 and supply it to the digital signal processing means 6, and the digital signal processing means 6 correct the distortion included in the digital audio signal on the basis of the error bit detected by the error bit detecting means 5.

When the function of this sort of switching means 1 is considered, it should be noted the storage means 2, occurrence frequency detecting means 3, normalizing means 4, and error bit detecting means 5 function as conversion error detecting means, and the digital signal processing means 6 function as conversion error correcting means.

First, the function of the conversion error detecting means (storage means 2, occurrence frequency detecting means 3, normalizing means 4, and error bit detecting means 5) will be described.

The storage means 2 employ a device capable of data storage, such as a hard disk, and store the digital audio signals supplied from the switching means 1.

The occurrence frequency detecting means 3 read the digital audio signals stored in the storage means 2 as samples. The digital audio signals include codes expressing the quantization levels. The occurrence frequency detecting means 3 count the occurrence frequency for every code expressing the quantization levels for a plurality of samples of the digital audio signals that were read. Namely, for a plurality of samples of the digital audio signals, a histogram (level distribution) is created to express the occurrence frequency for every code.

The codes expressing the quantization levels of the digital audio signals will now be described. The quantization level of the digital audio signal is represented as a binary number comprising a plurality of bits of 1 or 0. Increasing the number of bits enables smaller amplitude levels to be represented. For example, the amplitude levels represented by 13 binary bits can represent in decimal a range of −4096 to 4095. This range of −4096 to 4095 is used for the codes. A code of 0 indicates that the amplitude level in the analog signal is 0 and a large absolute value of the code indicates that the amplitude level in the analog signal is large.

Figure 2:
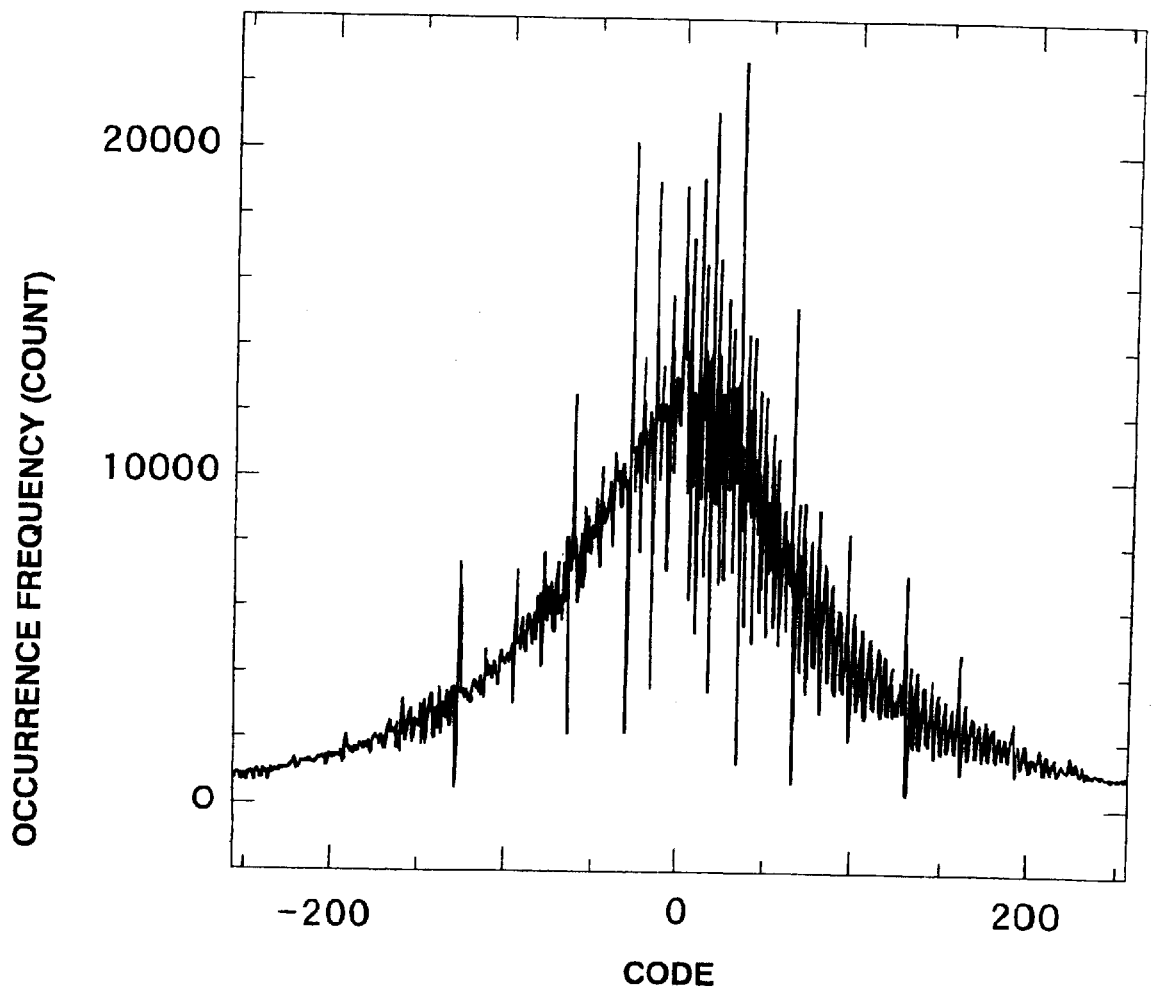
FIG. 2 shows an example of a histogram (level distribution) of a digital audio signal.

The histogram (level distribution) of the digital audio signal will be described. FIG. 2 shows an example of the histogram (level distribution) of the digital audio signal. The occurrence frequency in the histogram shown in FIG. 2 is substantially symmetrical in the positive and negative directions in the case of code 0 as the center, with the occurrence frequency high when the code is 0 and the occurrence frequency gradually decreasing as the code increases in the positive direction or decreases in the negative direction. A feature of this sort of histogram depends on the input audio signal. With respect to adjacent codes in this histogram, codes for which the occurrence frequency rapidly increases or codes for which the occurrence frequency rapidly decreases indicate distortion based on the conversion error.

The calculation method for histograms in the occurrence frequency detecting means 3 will be described. The occurrence frequency detecting means 3 comprise a histogram memory, which stores, using the code expressing the quantization level as the address, the occurrence frequency corresponding to the code at that address. The occurrence frequency detecting means 3 read the digital audio signal from the storage means 2, access the histogram memory using the code as the address, and read out the value stored in the histogram memory. This value is incremented by 1 and the incremented value is written to the same address. This process is repeated according to the number of samples. This determines the number accumulated for every code, namely, the occurrence frequency, and stores it into the histogram memory.

As to the number of samples for which this process is to be performed, not all the digital audio signals for which the distortion based on the conversion error is to be reduced are sampled. If the digital audio signals were converted by the same A/D converter, only part of the digital audio signal, such as a sample of the first few seconds, is sufficient. However, the accuracy of the histogram increases with the number of samples. For example, when 2,500,000 samples having consecutive portions of relatively high levels are used, an excellent histogram distribution can be obtained. It is possible to realize the creation of the histogram through a digital counter circuit or software.

The normalizing means 4 will be described next. The histogram of the codes generated as described above includes features dependent on the digital audio signals used in their generation. The normalizing means 4 remove the features dependent on the digital audio signals and extract features of the occurrence frequency accompanying the conversion error. More specifically, the normalizing means 4 can extract the distortion based on the conversion error of the digital audio signals as features of the occurrence frequency by dividing the occurrence frequency of the codes for which distortion based on the conversion error was generated, by the average occurrence frequency in a plurality of adjacent codes including codes for which distortion accompanying the conversion error was generated.

Specifically, a plurality of codes having adjacent quantization levels is divided into a plurality of blocks for all codes, for example, with four codes as one unit. The occurrence frequency for the codes (four codes) forming the block is averaged and an average occurrence frequency for every block is obtained. The occurrence frequency for each code forming the block divided by the average occurrence frequency of every block is the normalized occurrence frequency A for each code. The normalized occurrence frequency A of each code is expressed in the following formula.

Normalized occurrence frequency A=(occurrence frequency of codes grouped into four)/(average of occurrence frequency of four codes).

The histogram created from the normalized occurrence frequency A is the distortion based on the conversion error of the digital audio signal extracted as a feature of the occurrence frequency. Namely, the occurrence frequency A has the inherent occurrence frequency of the digital audio signal substantially removed. If there is no distortion based on the conversion error, the normalized occurrence frequency A becomes 1 for all codes. It should be noted that although the normalizing means 4 obtained, in the above example, the average of the occurrence frequency of each code within the blocks partitioned in advance as the average occurrence frequency, the moving average of each occurrence frequency of a predetermined number of codes in the vicinity of codes for which distortion based on the conversion error was generated may also be obtained as the average occurrence frequency.

As an example process (of a special case) in the normalizing means 4, a case will be described where a digital audio signal read from the storage medium 12 includes a digitized music signal that is or approximates a sine wave. When this sort of music signal is included, a normalized occurrence frequency can be obtained from a method similar to the calculation method for differential linearity error in conventional sine wave histogram measurement devices. Namely, in theory, a distortion-free sine wave histogram has a small occurrence frequency in the case of amplitude level 0, and as the amplitude level increases in the positive direction or decreases in the negative direction, the occurrence frequency rapidly increases symmetrically with respect to amplitude level 0 as the center. The occurrence frequency is at a maximum at the peak levels in the positive and negative directions. The histogram obtained according to theory represents the inherent occurrence frequency of the input digital audio signal. Therefore, it is possible to obtain the normalized occurrence frequency by inputting the digital audio signal that is or approximates a distortion-free sine wave, and dividing the occurrence frequency for every code by the occurrence frequency of the same code obtained from a theoretical value of the sine wave histogram.

The error bit detecting means 5 will be described next. The error bit detecting means 5 detect the error bit from the histogram that was normalized from the normalizing means 4. The normalized histogram includes codes for which the occurrence frequency is extremely high and codes for which the occurrence frequency is extremely low. The difference in quantization levels between codes for which the occurrence frequency is high and codes for which the occurrence frequency is low is represented by the weight of the bit for which distortion based on the conversion error was generated, or in other words, the digit position of the bit.

The cause of the conversion error differs depending on the conversion method that the A/D converter 11 employs in digitizing the audio signal. The A/D converter 11 is assumed herein to be a weighted resistance A/D converter or a successive approximation A/D converter using as an internal D/A converter, for example, a binary weight current source D/A converter having an R-2R ladder. Namely, it is assumed that the weight is used for the setting of the amplitude level, which is to be the threshold. In other words, taking note of the effect of a certain weight on a plurality of quantization levels, the plurality of quantization levels, namely, the weight, which is the cause of the distortion based on the conversion error, is detected from the occurrence frequency of the codes.

For example, if the interval between codes for which the occurrence frequency is extremely high is 2, namely, the interval of the quantization levels is $2^1$ times the quantization level of the least significant bit, it can be seen that the error is present at the least significant bit. If the interval between codes for which the occurrence frequency is extremely high is $2^3$, namely, the interval of the quantization levels is $2^3$ times the quantization level of the least significant bit, it can be seen that the error is present at the third bit position from the least significant bit. In other words, if the interval of the quantization levels for a plurality of codes, for which the occurrence frequency is extremely high, is $2^n$, it can be seen that the error is present at the n-th bit position from the least significant bit. A threshold is necessary to judge whether the occurrence frequency for a code is extremely high. For example, the occurrence frequency is judged to be extremely high if the normalized occurrence frequency A is 1.2 or higher. It is also possible to detect the bit position of the bit with error from the interval between codes for which the occurrence frequency is extremely low. Furthermore, the bit with error can also be detected using a combination of both methods.

Figure 3:
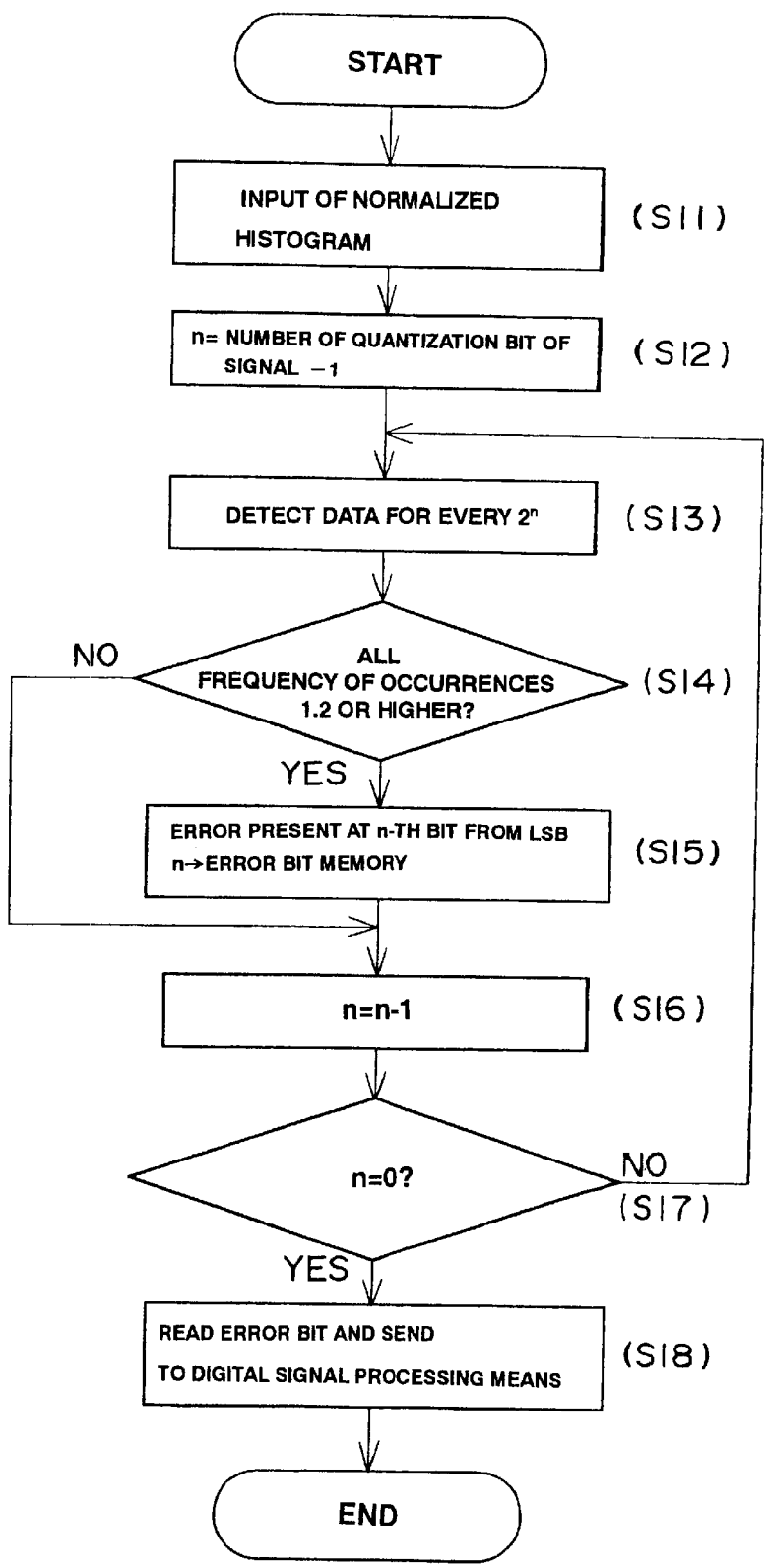
FIG. 3 is a flowchart showing an example of an error bit detection process.

The error bit detection process in the error bit detecting means 5 will be described. FIG. 3 is a flowchart showing an example of the error bit detection process of the error bit detecting means 5.

In the example process of FIG. 3, the normalized histogram from the normalizing means 4 is first input by the error bit detecting means 5 (step S11). Next, the initial value of a variable n is set as the value of the number of quantization bits of the digital audio signal decremented by 1 (step S12). Next, the normalized occurrence frequency of each code is extracted for every $2^n$ quantization levels of each code (step S13). It is then judged whether the entire occurrence frequency extracted for a given n is 1.2 or higher (step S14). If the occurrence frequency is 1.2 or higher, error is judged to be present at the n-th bit from the least significant bit, and the value of n is stored into the error bit memory (step S15). If the occurrence frequency is lower than 1.2, the value of n is updated by decrementing n by 1 (step S16). It is then judged whether or not the value of n is 0. If the value of n is not 0, execution returns to the process of again extracting the normalized occurrence frequency of each code for every $2^n$ quantization levels of each code (step S17). If the value of n is 0, the error bit that was stored into the error bit memory is output to the digital signal processing means 6 (step S18). The process just described allows the error bit to be detected.

Figure 4:
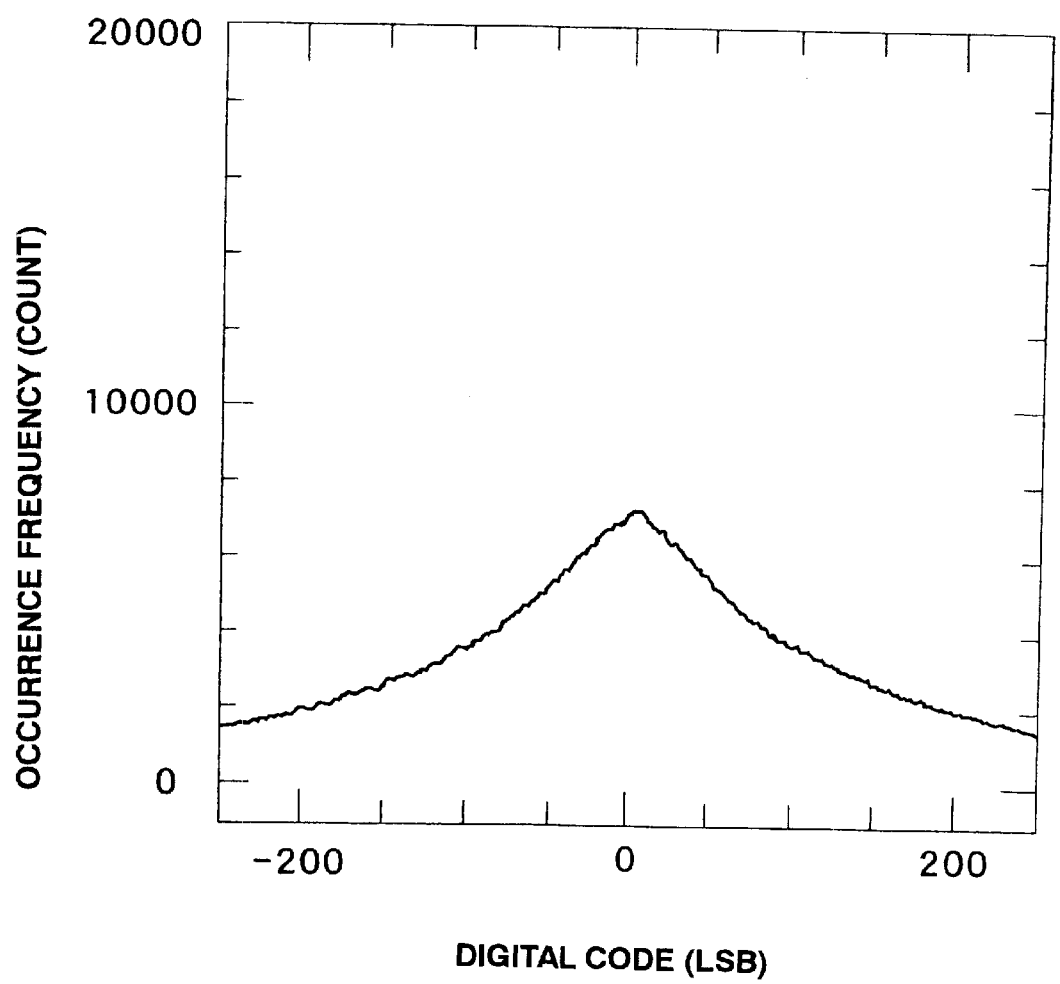
FIG. 4 shows an example of a level distribution of a music signal using a modern A/D converter having good precision.
Figure 5:
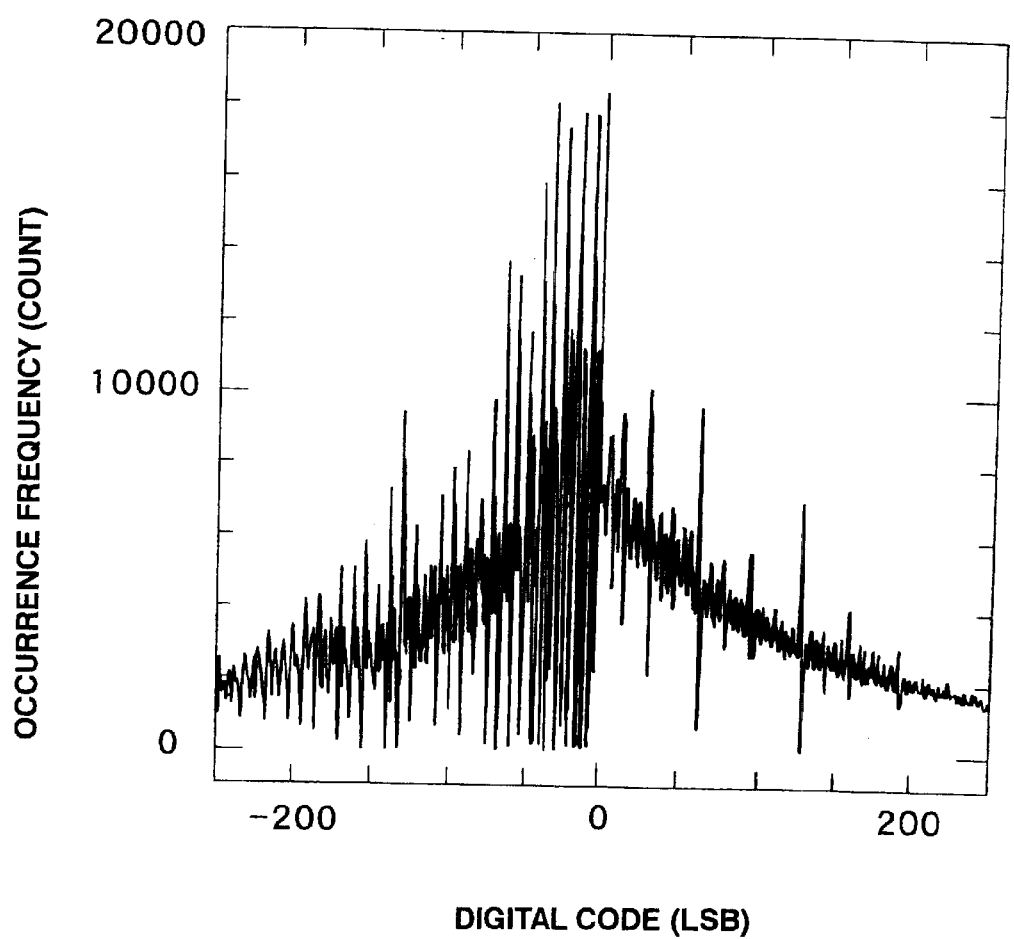
FIG. 5 shows an example of a level distribution of an early PCM music signal.

FIG. 4 shows an example of the level distribution of a music signal using a modern, high-accuracy A/D converter. FIG. 5 shows an example of the level distribution of an early PCM music signal. Both level distributions of 2,500,000 samples (approximately one minute at a sampling frequency of 44.1 kHz) use the same music signal. The ordinate is the occurrence frequency and the abscissa is in LSB units of 13 bits. The level distribution of the (lengthy) music signal assumes a shape approximating the normal distribution with 0 (LSB) at its center, the trend of which is shown in FIG. 4. Although FIG. 5 shows a shape very nearly approximating the normal distribution, the occurrence frequency has extremely high levels and extremely low levels when compared to FIG. 4. This is due to the error in the successive approximation A/D converter. In an ideal A/D converter, the analog input voltage has a width of ±0.5 (LSB) with respect to one output level. However, in a real successive approximation A/D converter, this width is not constant since error is present in the internal D/A converter and so forth. Thus, since the width of the input analog voltage of the A/D converter at a level larger than ±0.5 (LSB) includes data to be converted to adjacent levels, the occurrence frequency of that level is large. Conversely, with the width of the input analog voltage of the A/D converter at a level smaller than ±0.5 (LSB), the occurrence frequency of that level is small. Therefore, if the level distribution of the music signal is used, it is possible to detect the error of the A/D converter that was used by the process described above.

In this manner, it is possible for the conversion error detecting means (storage means 2, occurrence frequency detecting means 3, normalizing means 4, error bit detecting means 5) to estimate (detect), from the digital audio signal (pre-recorded music signal) converted from analog to digital by the A/D converter having linearity error, the distortion based on the linearity error of the A/D converter at the time of A/D conversion.

The digital signal processing means 6 functioning as the conversion error correcting means will be described next. After the conversion error (error bit), which is generated at the time of A/D conversion and included in the digital audio signal, is detected as described above, the digital signal processing means 6 input, for example, a digital audio signal that is identical to the signal that was input by the conversion error detecting means from the switching means 1. On the basis of the conversion error (error bit) at the time of A/D conversion detected by the error bit detecting means 5, the digital signal processing means 6 perform correction of the distortion based on the conversion error of the digital audio signal so as to reduce distortion. Namely, among a plurality of samples having quantization levels for which the occurrence frequency is high due to distortion based on the conversion error, the quantization level of the sample for which distortion was generated due to the conversion error is corrected to a quantization level that is estimated to be the correct quantization level so that the distortion accompanying conversion error is reduced.

Figure 6:
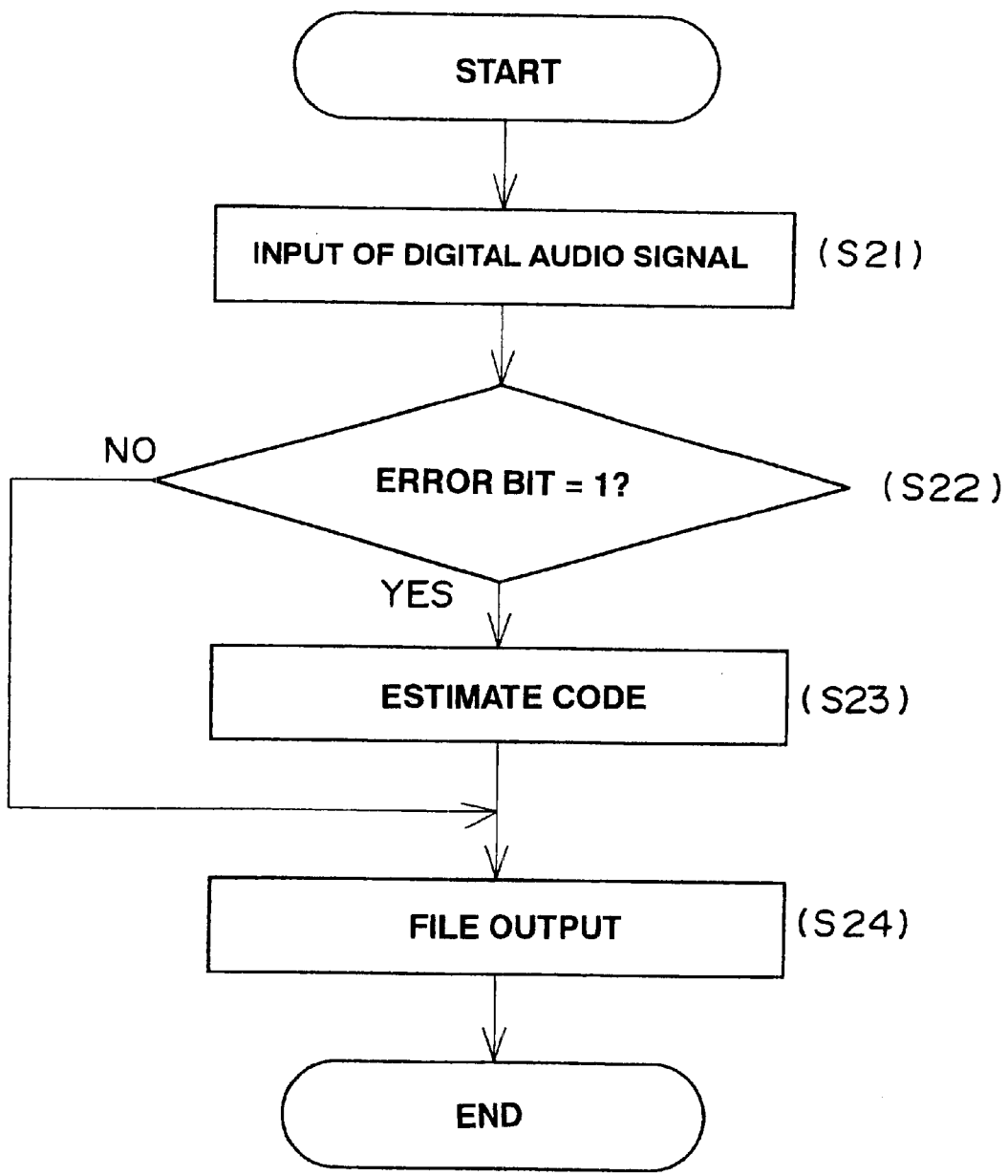
FIG. 6 is a flowchart showing an example of a correction process in digital signal processing means.

FIG. 6 is a flowchart showing an example of the correction process in the digital signal processing means 6.

In the example process of FIG. 6, the digital signal processing means 6 is supplied from the switching means 1 with the code of each sample of the digital audio signal for which the error is to be reduced (step S21) and it is judged whether or not the value at the digit position of the error bit at every sample is 1 (step S22). If the value at the digit position of the error bit has a code of 1 (code where the quantization level is affected by the error bit), the correct quantization level of the sample, namely, the correct code, is estimated (step S23). If the value at the digit position of the error bit has a code that is not 1, the code of the input sample or the code estimated in the above-mentioned process is written to a file and output (step S24). At this time, the data showing the position on the time axis, namely, the positional order of the sample from the beginning, is also output to the file together with the code. From the above-mentioned process, the code for which distortion based on the conversion error was generated is corrected to a code estimated to be correct so as to reduce the distortion accompanying the conversion error.

The correction of the code affected by the distortion based on the conversion error will now be described. Suppose the LSB is the quantization level of the least significant bit, a and b are positive integers, and N is 0 or a positive integer.

For example, if the internal resistance of the successive approximation A/D converter has an error of +b·LSB at the a-th bit from the least significant bit, the occurrence frequency of the code for which the quantization level is $2^a \cdot N + 2^{a-1} - b$ is multiplied by b+1, and the occurrence frequency of each code, for which the quantization level is from $2^a \cdot N + 2^a - 1$ to $2^a \cdot N + 2^a - b$, is 0.

If an error of −b·LSB is present at the a-th bit from the least significant bit, the occurrence frequency for which the quantization level is $2^a \cdot N + 2^{a-1} - 1$ is multiplied by b+1, and the occurrence frequency of each code, for which the quantization level is from $2^a \cdot N + 2^{a-1} - 1$ to $2^a \cdot N + 2^{a-1} + b - 1$, is 0.

Therefore, when correction is performed so that this sort of error is canceled, the distortion accompanying the conversion error is reduced. However, sample data, which should be of codes with a low occurrence frequency, is erroneously converted to codes with a high occurrence frequency. In other words, a plurality of samples having quantization levels with a high occurrence frequency also includes other samples that have other quantization levels.

To correct the above-mentioned erroneous conversion, a plurality of codes for which the occurrence frequency is extremely high due to the influence of one error bit detected by the error bit detecting means 5 are obtained. Suppose the average of the occurrence frequency for these plurality of codes is X. For the sample having the code for which the occurrence frequency is extremely high due to the influence of the above-mentioned error bit, the code in proportion to the above-mentioned value of X is converted, at a rate of one part to X parts, for example, to one or a plurality of codes for which the occurrence frequency is extremely low due to the above-mentioned one error bit. If error is present in a plurality of bits, the above-mentioned process is performed for each individual bit.

In the error bit detecting means 5, the quantization level affected by the detected error bit is judged whether to be corrected to either positive or negative from the quantization level difference of adjacent samples on the time axis.

Figure 7:
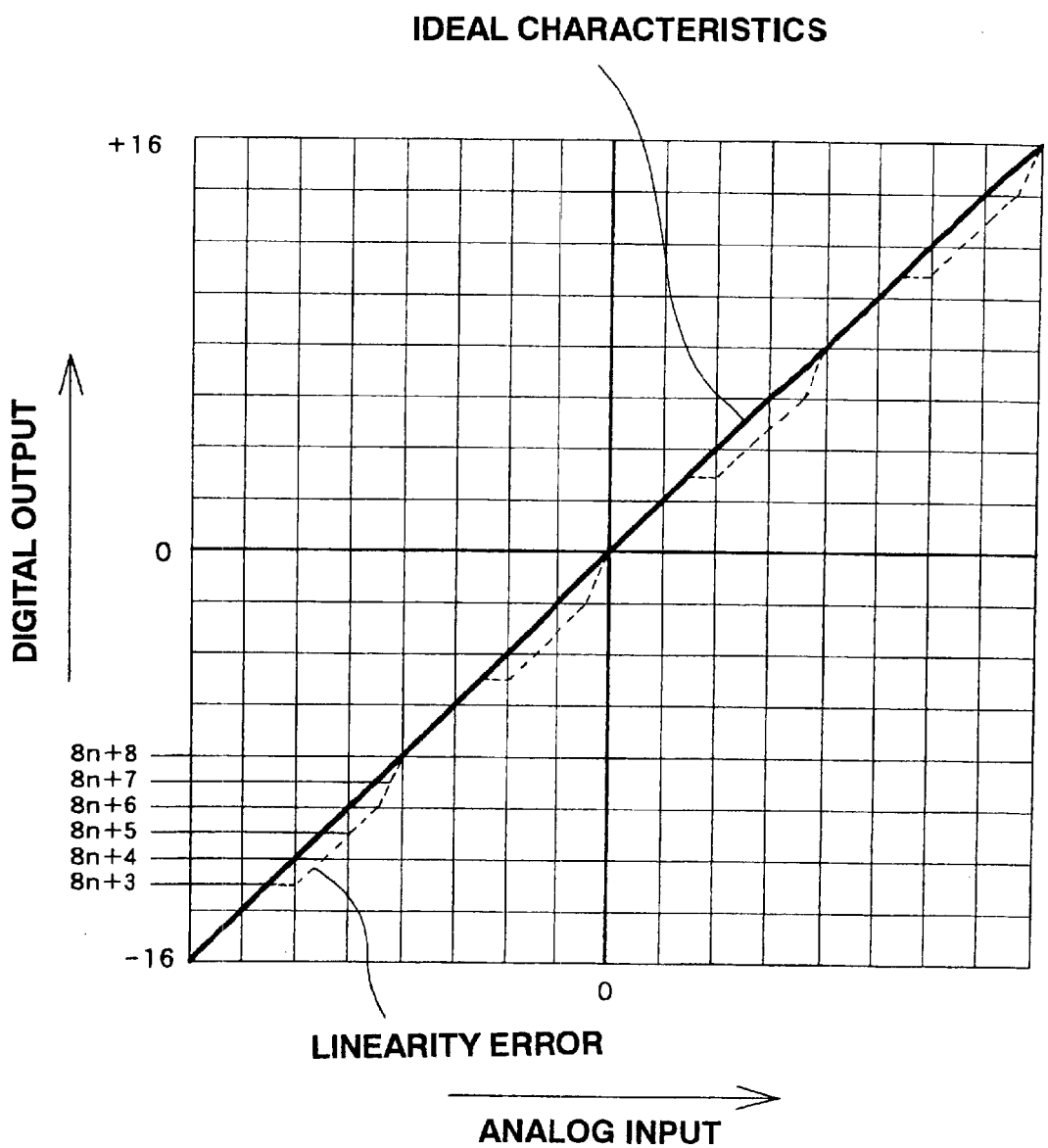
FIG. 7 illustrates the analog/digital conversion characteristics of the analog/digital converter.

A process to estimate codes without the distortion accompanying the conversion error will be described. FIG. 7 shows the A/D conversion characteristics of the analog/digital converter (A/D converter) 11. For a code for which the value at the digit position of the error bit is 1, an internal file is read to determine the number of samples the code is in succession on the time axis. For example, if an error of b=+1·LSB is judged to be present at the a=3 bit position from the least significant bit, the A/D converter assumes the I/O characteristics shown in FIG. 7. In other words, at 8n+3, the digital output does not vary with respect to an increase equivalent to +1·LSB in the analog input. Therefore, at 8n+3, the occurrence frequency becomes extremely high. At 8n+7, the digital output becomes 8n+8 with respect to an increase equivalent to +1·LSB in the analog input and the occurrence frequency decreases.

Figure 8:
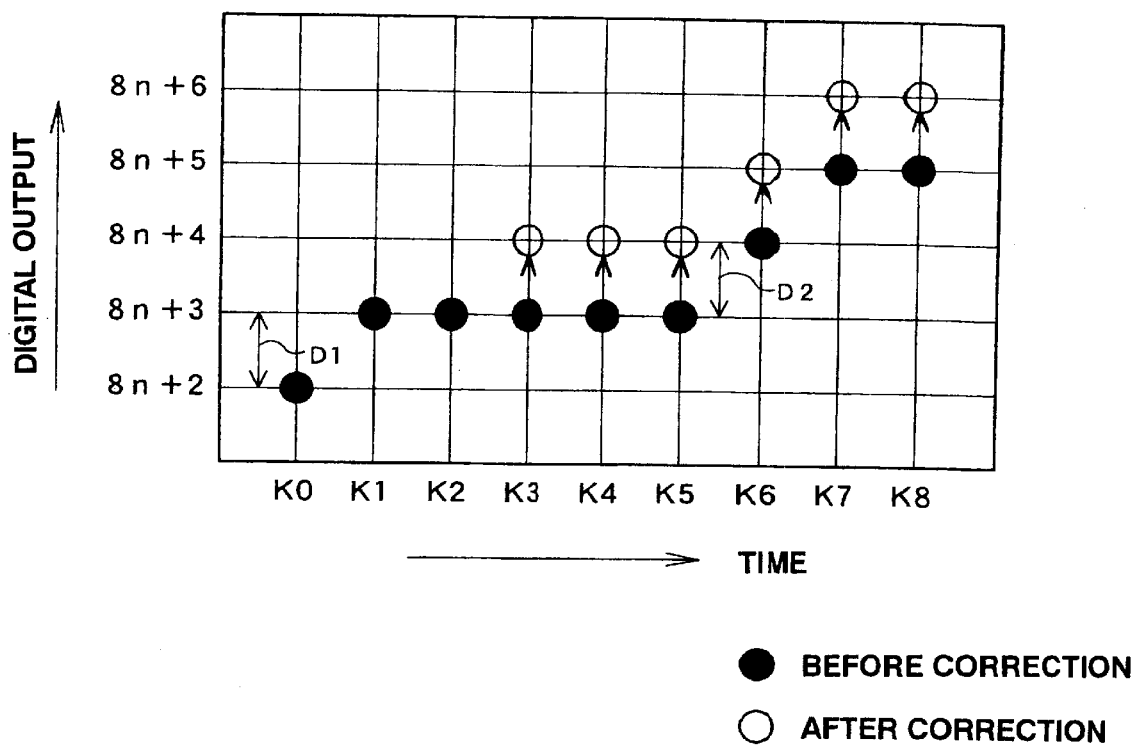
FIG. 8 shows a typical time-base digital output in the distortion correcting device according to the present invention.

FIG. 8 illustrates the digital output on the time axis in the distortion correcting device of the present invention. In FIG. 8, the digital outputs corresponding to 8n+4 to 8n+6 are all converted to values larger by +1·LSB so as to reduce the distortion accompanying the conversion error of the digital audio signal. The samples of the digital output corresponding to 8n+3 are denoted as $K_1, K_2, K_3, \ldots, K_t$. If t samples, greater than or equal to 2 samples, corresponding to 8n+3 are in succession, the difference between the digital outputs of $K_1$ and one sample preceding it, or sample $K_0$, is taken, and this difference is denoted as $D_1$. Furthermore, the difference between the digital outputs of $K_t$ and one sample succeeding it, or sample $K_{t+1}$, is taken, and this difference is denoted as $D_2$. If differences $D_1$ and $D_2$ are both positive, the above-mentioned value of X is used and the values from $K_{t/X}$ to $K_t$ are incremented by 1. If differences D1 and D2 are both negative, the above-mentioned value of X is used and the values from $K_1$ to $K_{t(1-1/X)}$ are incremented by 1. If the value of t/X is not an integer, the value is rounded up or rounded down so that the value of t/X is an integer.

As a result, the samples of the digital output corresponding to 8n+3 are converted to values larger by +1·LSB at a rate of once in X times. The sample to be converted is determined by differences $D_1$ and $D_2$ of quantization levels of adjacent samples on the time axis. The preceding described the base where it was judged that the error of b=+1·LSB was resent. Regardless of whether b is another value, it is possible to similarly estimate the codes without the distortion accompanying the conversion error.

The linearity error reduction process for the A/D converter having the above-mentioned configuration will be described with reference to FIG. 1. When the digital audio signal from the storage medium 12 is input by the switching means 1, the switching means 1 switch the input digital audio signal so that it is output to the storage means 2.

The storage means 2 store the digital audio signal from the switching means 1.

The occurrence frequency detecting means 3 read a plurality of samples of the digital audio signal temporarily stored in the storage means 2, count the occurrence frequency of the samples for every code expressing the quantization level, and create a histogram.

The normalizing means 4 extract the distortion accompanying the conversion error on the basis of the occurrence frequency of codes from the histogram output from the occurrence frequency detecting means 3, and output it as a normalized histogram. If distortion accompanying the conversion error is not generated in the digital audio signal, the value of the occurrence frequency of each code is identical to each other. However, if distortion accompanying the distortion error is generated, a difference in occurrence frequency among codes develops.

The error bit detecting means 5 detect the error bit of the digital audio signal from differences in the occurrence frequency in each code on the basis of the normalized histogram generated by the normalizing means 4, and output it to the digital signal processing means 6.

Next, the switching means 1 switch the digital audio signal that was read from the storage medium 12 so that it is output to the digital signal processing means 6 via the digital interface.

To the digital signal processing means 6 are input the digital audio signal that was read from the storage medium 12 and the detection result of the error bit at which the linearity error in the digital audio signal was generated.

The digital signal processing means 6 correct and output the digital audio signal having the erroneously corrected code due to conversion error on the basis of the detection result from the error bit detecting means 5 to values close to the proper levels without the distortion accompanying the conversion error. The output digital audio signal becomes a digital audio signal with reduced distortion accompanying the conversion error.

As described above, a code that has been converted to an erroneous value due to the conversion error of the digital audio signal can be easily corrected, and the distortion based on the conversion error can be reduced.

As a correcting method for the distortion accompanying the conversion error in the above-mentioned process, various interpolation techniques can be used in estimating the quantization level of a given sample from the quantization level of adjacent samples on the time axis with respect to successive samples having codes for which the quantization level is affected by the error bit judged by the error bit detecting means 5.

Furthermore, in the above-mentioned distortion correcting device, it is possible to configure the conversion error detecting means (storage means 2, occurrence frequency detecting means 3, normalizing means 4, error bit detecting means 5) as a single device. Namely, the present invention can be implemented as the distortion detecting device only for detecting the conversion error (distortion) at the time of A/D conversion included in the digital audio signal.

In the above-mentioned example configuration, the normalizing means 4 and the error bit detecting means 5 obtain a histogram from the occurrence frequency of codes expressing the quantization levels of the recorded music signal (digital audio signal), and judge the error bit where the A/D conversion error was generated on the basis of unevenness in the occurrence frequency greater than or equal to the threshold in the histogram, and the digital signal processing means 6 correct the code of the error bit on the basis of the preceding and succeeding codes. Namely, the unevenness in the occurrence frequency greater than or equal to the threshold in the histogram is judged to be caused by the error bit so that correction is performed on the basis of the codes preceding and succeeding the unevenness. Thus, in the device having the above-mentioned configuration, it may not be possible to substantially reduce the A/D conversion error since the unevenness in the occurrence frequency at or lower than the threshold is not judged to be caused by the error bit and is not corrected.

So as to also correct the unevenness in the occurrence frequency at or lower than the threshold and to substantially reduce the A/D conversion error, the inventor of this application further proposes a device described as an embodiment in the following.

Figure 9:
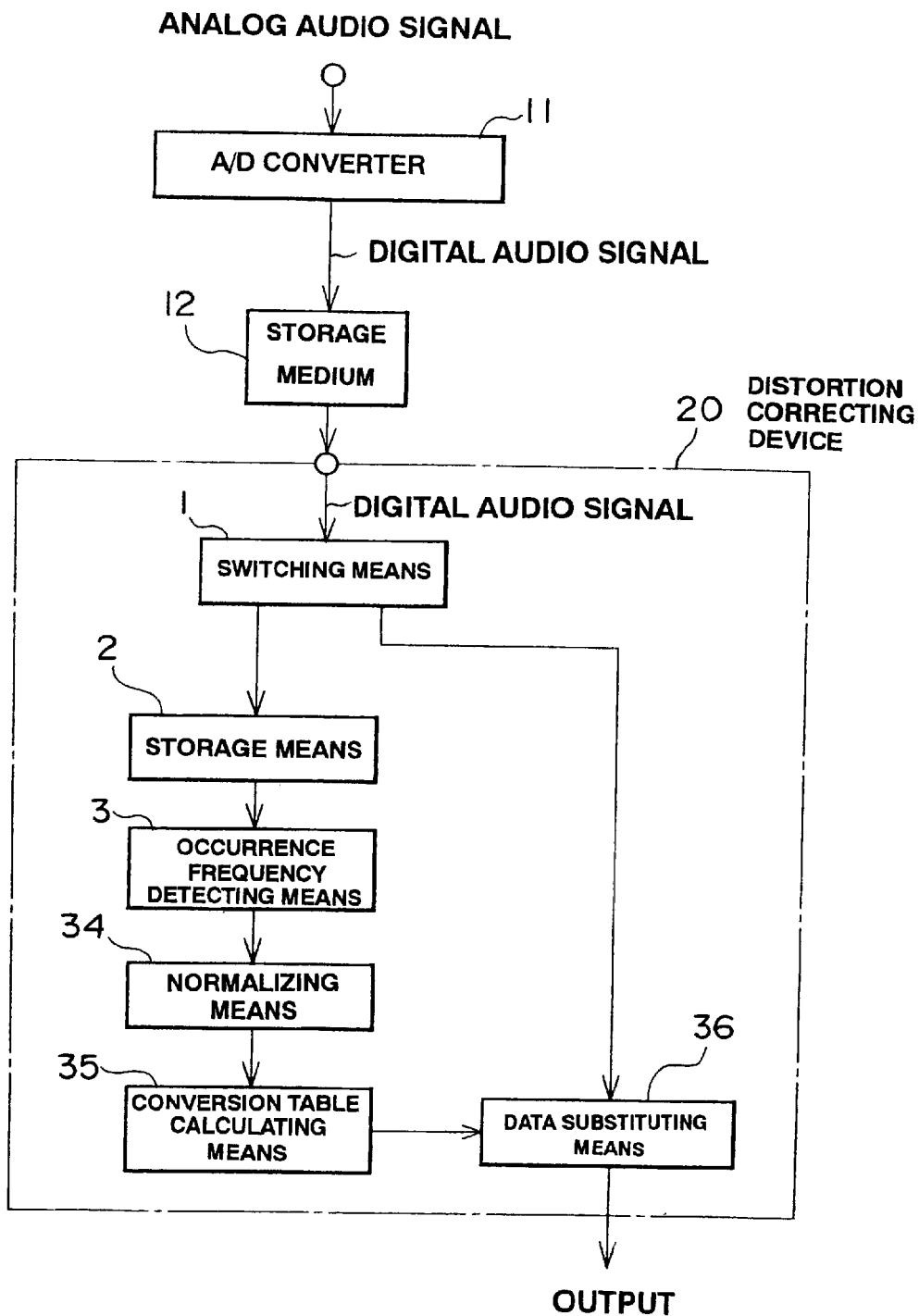
FIG. 9 is a block diagram showing another example configuration of the distortion correcting device relating to the present invention.

FIG. 9 is a block diagram showing another example configuration of the distortion correcting device relating to the present invention. It should be noted that the compositional elements in FIG. 9 identical to those in FIG. 1 have identical reference numerals. Referring to FIG. 9, a distortion correcting device 20 comprises the switching means 1 for switching the destination of the output of the digital audio signal (music signal) converted to code by the A/D converter 11, the storage means 2 for storing the digital audio signal input from the switching means 1, the occurrence frequency detecting means 3 for reading the digital audio signal from the storage means 2 and obtaining a plurality of samples, counting the occurrence frequency of the samples for every code expressing the quantization level, and detecting as a histogram (level distribution), normalizing means 34 for applying a low-pass filtering process on the level distribution detected by the occurrence frequency detection means 3, obtaining the level distribution approximating the ideal case where the analog/digital converter has no error, dividing the level distribution before the low-pass filtering process is applied, by the level distribution approximating the ideal case, and generating a normalized level distribution, conversion table calculating means 35 for calculating a conversion table T(i) for the level of the digital audio signal from the level distribution normalized by the normalizing means 34 and storing it to a predetermined memory, and data substituting means 36 for substituting the level of the digital audio signal read from the storage medium 12 with the level data according to the conversion table T(i).

Namely, in the example configuration of FIG. 9, the normalizing means 34 include the low-pass filtering process function, apply the low-pass filtering process on the histogram (level distribution) created by the occurrence frequency detecting means 3, and approximate the low-pass filtered histogram (level distribution) as a histogram (level distribution) of the ideal case where there is no error in the A/D converter 11. The normalizing means 34 then create a distribution normalized with the occurrence frequency at 1.0 in the case where there is no error by dividing the histogram (level distribution) before the low-pass filtering process was applied, by the histogram (level distribution) after the low-pass filtering process was applied. The conversion error of the A/D converter 11 is detected on the basis of this normalized distribution.

More specifically, if the occurrence frequency of level i of the digital audio signal (music signal) is denoted by g(i), the number of quantization bits is denoted by n, and the number of samples for which the average of the low-pass filter (moving average filter) is taken is denoted by m (where m is an odd number), the normalizing means 34 obtain the normalized value N(i) from the following formula.

$$N(i) = \frac{g(i)}{\sum_{j=-\frac{m-1}{2}}^{\frac{m-1}{2}} [g(i+j) \cdot c(j)]} \quad (2)$$

$$\left(-2^{N-1} + \frac{m-1}{2} < i < 2^{n-1} - \frac{m-1}{2} - 1\right)$$

Here, c(j) is a window function satisfying the following formula.

$$\sum_{j=-\frac{m-1}{2}}^{\frac{m-1}{2}} c(j) = 1.0 \quad (3)$$

In other words, the process of the above formula expresses the moving average filter using the window function c(j). Furthermore, in the moving average method, since calculations for both ends of the smoothed waveform are impossible and both ends of the smoothed waveform have high music levels, the value of (m−1)/2 corresponding to the sample at both ends of the smoothed waveform is excluded from the range of code i in the above-mentioned formula (2) because such a high level does not exist in practice and can be ignored.

In this manner, the normalizing means 34 of the distortion correcting device 20 of FIG. 9 calculate the average value with the value in the neighborhood using the moving average filter on the occurrence frequency g(i) of digital code i of the digital audio signal (music signal) so that the occurrence frequency g(i) of digital code i of the digital audio signal (music signal) approximates the ideal occurrence frequency, on the basis of which normalization is performed. As a result, the ideal level distribution can be calculated even if there is a bias peculiar to the type of music in the level distribution of the digital audio signal (music signal) after A/D conversion. Namely, normalization can be performed.

Furthermore, the conversion table calculating means 35 specifically obtain conversion table T(i) by estimating as shown in formula (4) the normalized value N(i) obtained by the normalizing means 34 as described above, and store the conversion table, such as to a conversion table memory.

T(0)=0

T(i)=T(i−1)+{N(i−1)+N(i)}/2(i>0)

T(i)=T(i+1)−{N(i)+N(i+1)}/2(i<0)  (4)

Figure 10:
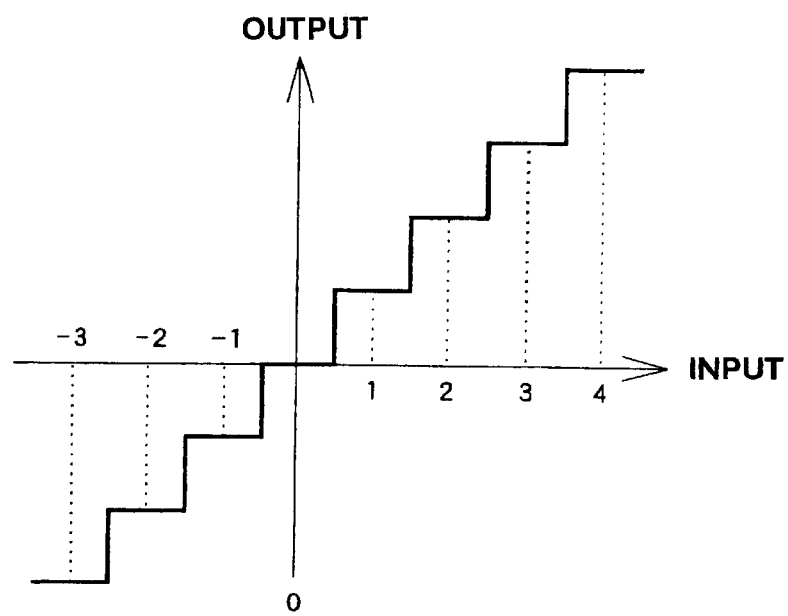
FIG. 10 shows the conversion characteristics of an ideal A/D converter.

Essentially, the ideal A/D converter assumes the conversion characteristics (I/O characteristics) shown in FIG. 10. However, if a conversion error is present in the A/D converter, the A/D converter assumes the conversion characteristics (I/O characteristics) shown in FIG. 11.

Figure 11:
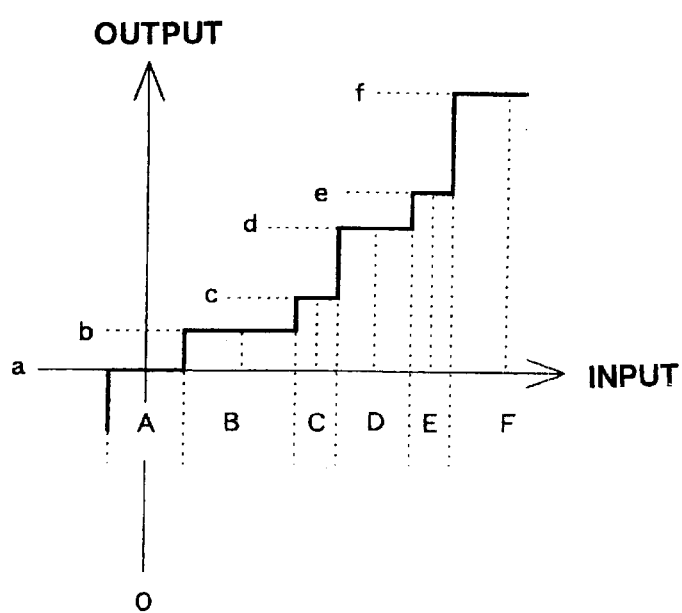
FIG. 11 shows the conversion characteristics of the A/D converter when conversion error is present in the A/D converter.
Figure 12:
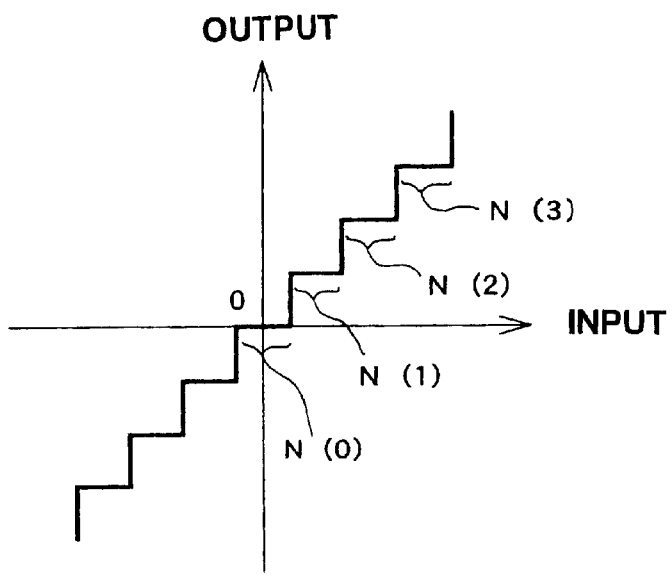
FIG. 12 illustrates a method of calculating the conversion table.
Figure 13:
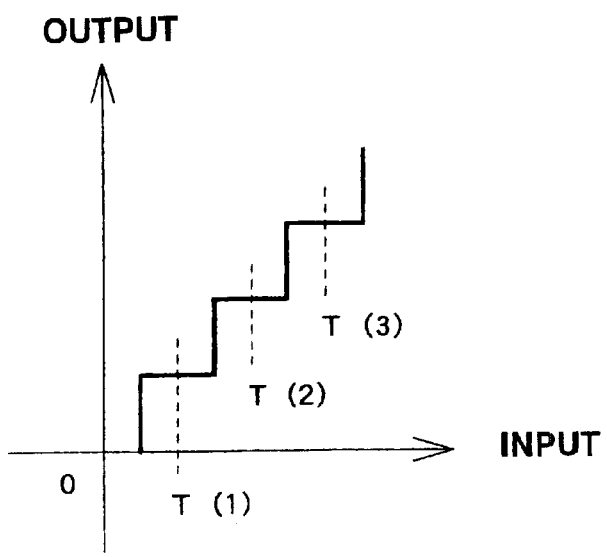
FIG. 13 illustrates a method of calculating the conversion table.
Figure 14:
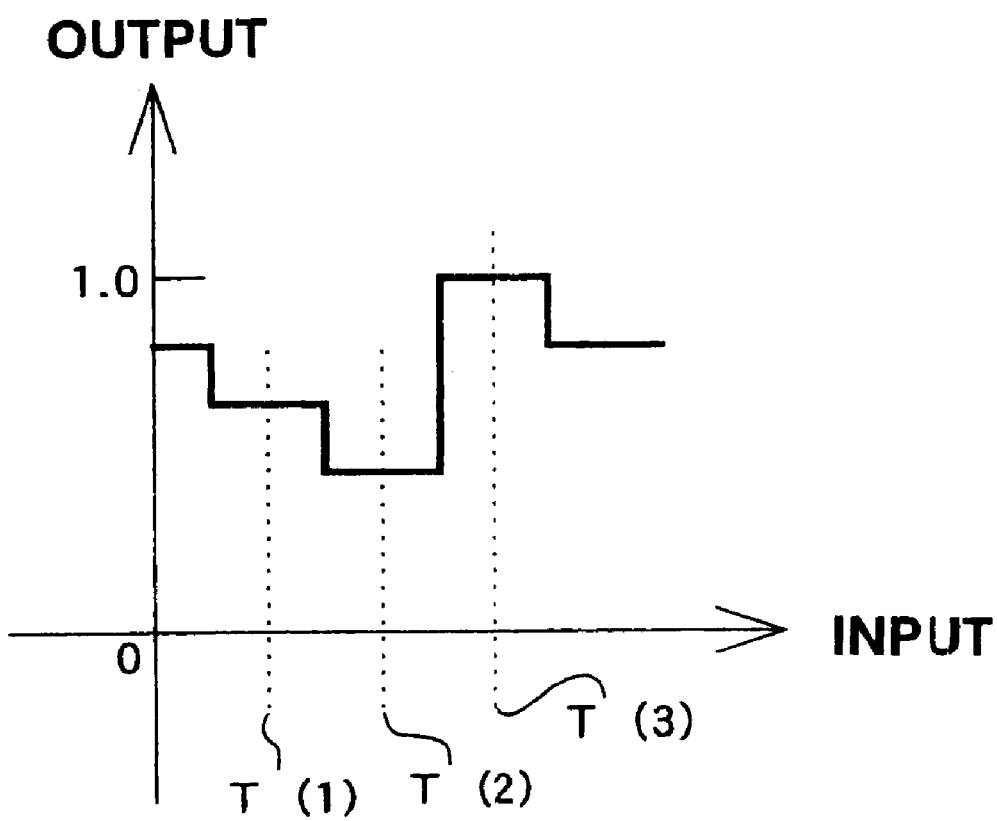
FIG. 14 illustrates a method of calculating the conversion table.

In FIG. 11, the part at level b has a high occurrence frequency and the part at level c has a low occurrence frequency. The normalized level distribution N(i) indicates the input level width (A to F) of each level (a to f). Thus, for example, for level b, N(b)=(A+B)/2, which is the median of input level width B, is the central value. Similarly, for level c, it becomes N(c)=(A+B)/2+(B+C)/2, and for level d, it becomes N(d)=(A+B)/2+(B+C)/2+(C+D)/2. Formula (4) expresses the accumulation process for N(i). If the conversion table T(i)=N(i), the value of N(i) is not accumulated so that the value of the correct T(i) is not obtained. In other words, as shown in FIG. 12, N(i) corresponds to the horizontal width of the stairs, and the T(i) to be obtained is the median of the stairs shown in FIG. 13. However, if T(i)=N(i), N(i) is not accumulated so as to result in FIG. 14. In the case of formula (4), N(i) is accumulated so that the correct T(i) is obtained.

The data substituting means 36 extracts the value T(i) corresponding to level i of the digital audio signal read from the storage medium 12 from the conversion data table obtained as described above so that the value T(i) can be output as a digital audio signal corrected for distortion. More specifically, the value T(i) of the conversion table calculated by the conversion table calculating means 35 is stored in a conversion table memory using the code i itself, which expresses the quantization level, as the address. In this case, using the digital audio signal (code expressing the quantization level) i read from the storage medium 12, the data substituting means 36 can read the value T(i) corresponding to the address (level i) and output this as the digital audio signal corrected for distortion.

In this manner, in the example configuration of FIG. 9, from the level distribution of the digital audio signal recorded using the analog/digital converter is detected the conversion error of the analog/digital converter that is used, the conversion table is calculated from the detected conversion error, the conversion process is performed on the digital audio signal on the basis of the conversion table, and the distortion generated due to the conversion error of the analog/digital converter is corrected so that the unevenness in the occurrence frequency is corrected at or below the threshold and the A/D conversion error can be substantially reduced.

Furthermore, in the example configuration of FIG. 9, lengthening the bit length of the conversion table T(i) beyond the bit length of the input data, for example, also allows the bit length to be extended (such as from 13 bits to 16 bits).

More specifically, if the values of the 13-bit signal range from $-2^{13-1}$ to $2^{13-1}-1$ (−4096 to +4095), the signal after table-based conversion generates a decimal fraction value due to the calculation. For example, in the case where the level distribution g(i) is g(0)=100 g(1)=150 g(2)=50 g(3)=100 the level distribution h(i) after low-pass filtering is h(0)=h(1)=h(2)=h(3)=100

The level distribution h(i) is obtained in the following formula from the low-pass filter formula.

$$h(i) = \sum_{j=-\frac{m-1}{2}}^{\frac{m-1}{2}} [g(i+j) \cdot c(j)] \quad (5)$$

$N(i)=g(i)/h(i)$ yields $N(0)=100/100=1.0$ $N(1)=150/100=1.5$ $N(2)=50/100=0.5$ $N(3)=100/100=1.0$ Moreover, formula (4) yields $T(0)=0.0$ $T(1)=0.0+(1.0+1.5)/2=1.25$ $T(2)=1.25+(1.5+0.5)/2=2.25$ $T(3)=2.25+(0.5+1.0)/2=3.0$ A decimal fraction value is generated from the table-based conversion. This decimal fraction value form the low order bits, and determining until which value to output enables the conversion to a signal having an arbitrary bit length.

Figure 15:
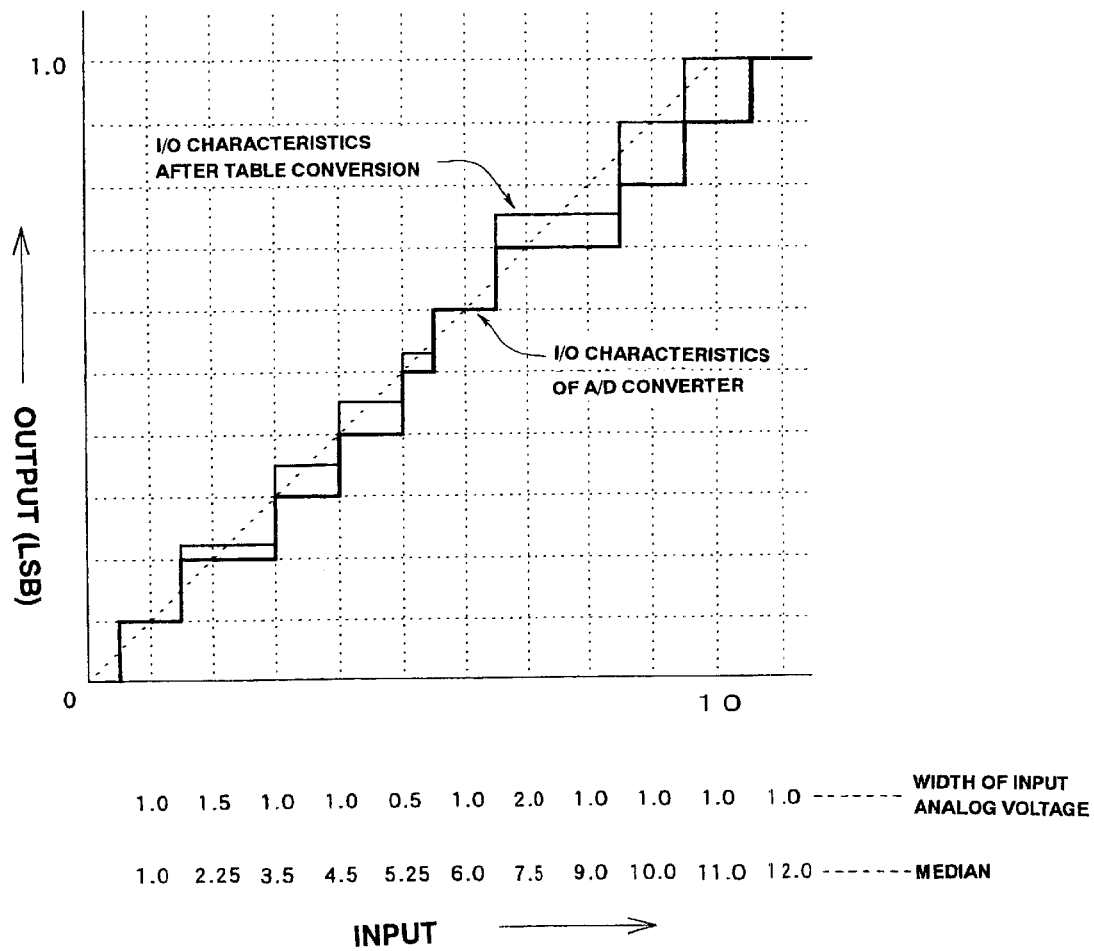
FIG. 15 shows part of the I/O characteristics before and after table-based conversion.
Figure 16:
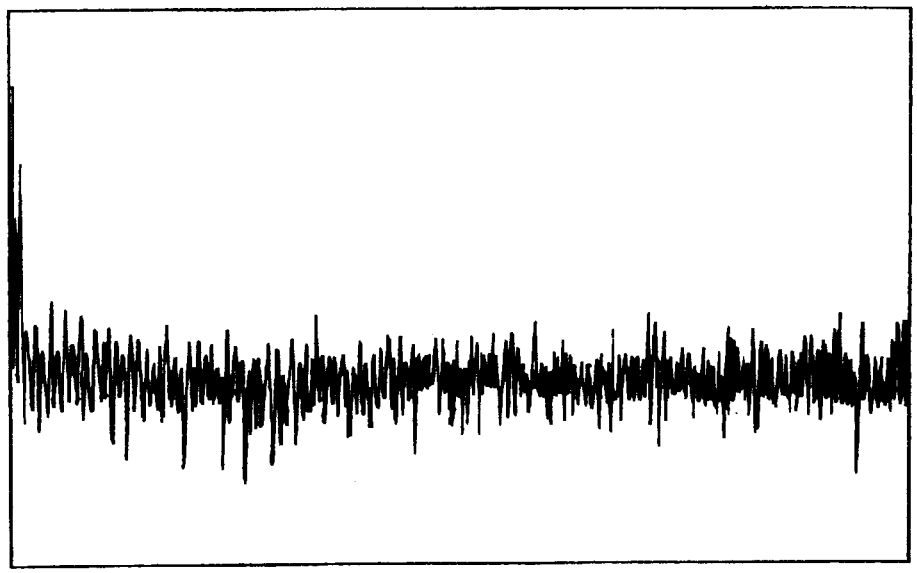
FIG. 16 shows the result of performing the table-based conversion process on the digital audio signal.
Figure 17:
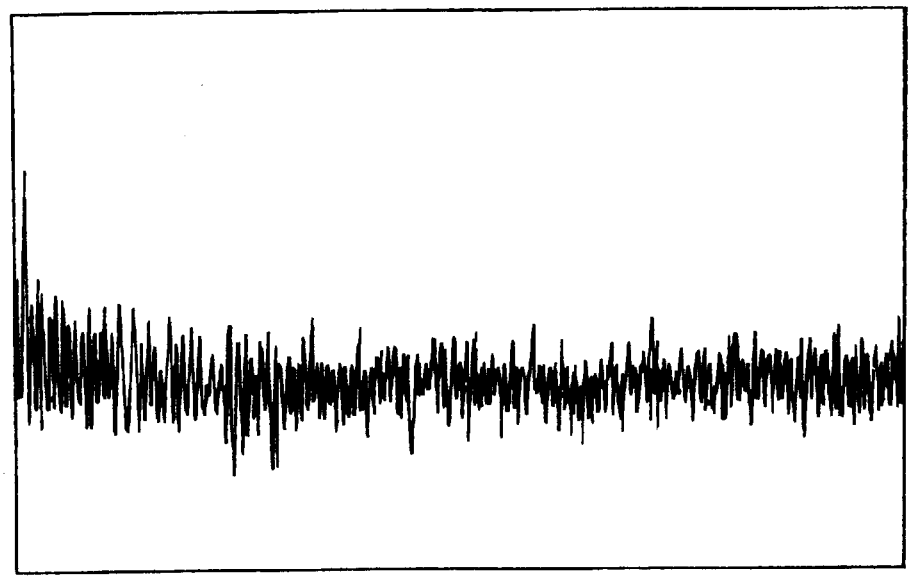
FIG. 17 shows the case of not performing the table-based conversion process on the digital audio signal.

FIG. 15 shows part of the I/O characteristics before and after table-based conversion. In FIG. 15, the abscissa is the input (analog) and the ordinate is the output (LSB units in the case of 13 bits for the I/O characteristics of the A/D converter and 16 bits for the I/O characteristics after table-based conversion). For the output signal for when a 100 Hz, −40 dB sine wave is input to a successive approximation A/D converter (bit length of 13 bits) having large error, the conversion process using the conversion table calculated from the digital audio signal (music signal) recorded by the same A/D converter is performed, and then the Hanning window fast Fourier transform (FFT) for 81920 points is performed, the plot of which is shown in FIG. 16. FIG. 17 shows a case where the above-mentioned process according to the present invention is not performed. When FIG. 16 and FIG. 17 are compared, the case where the table-based conversion process is performed (FIG. 16) has a lower distortion compared to the case where the table-based conversion process is not performed (FIG. 17).

Figure 18:
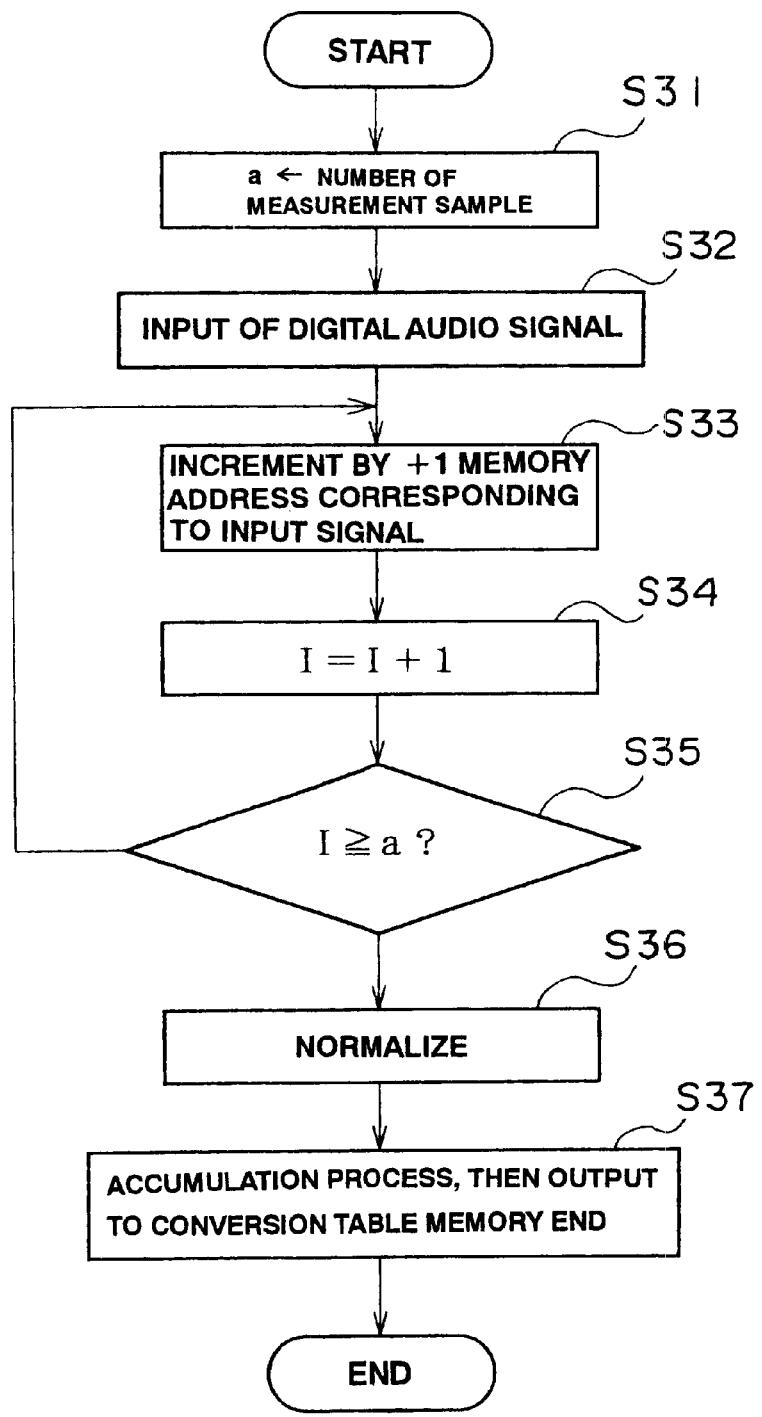
FIG. 18 is a flowchart illustrating the process operation of the distortion correcting device shown in FIG. 9.
Figure 19:
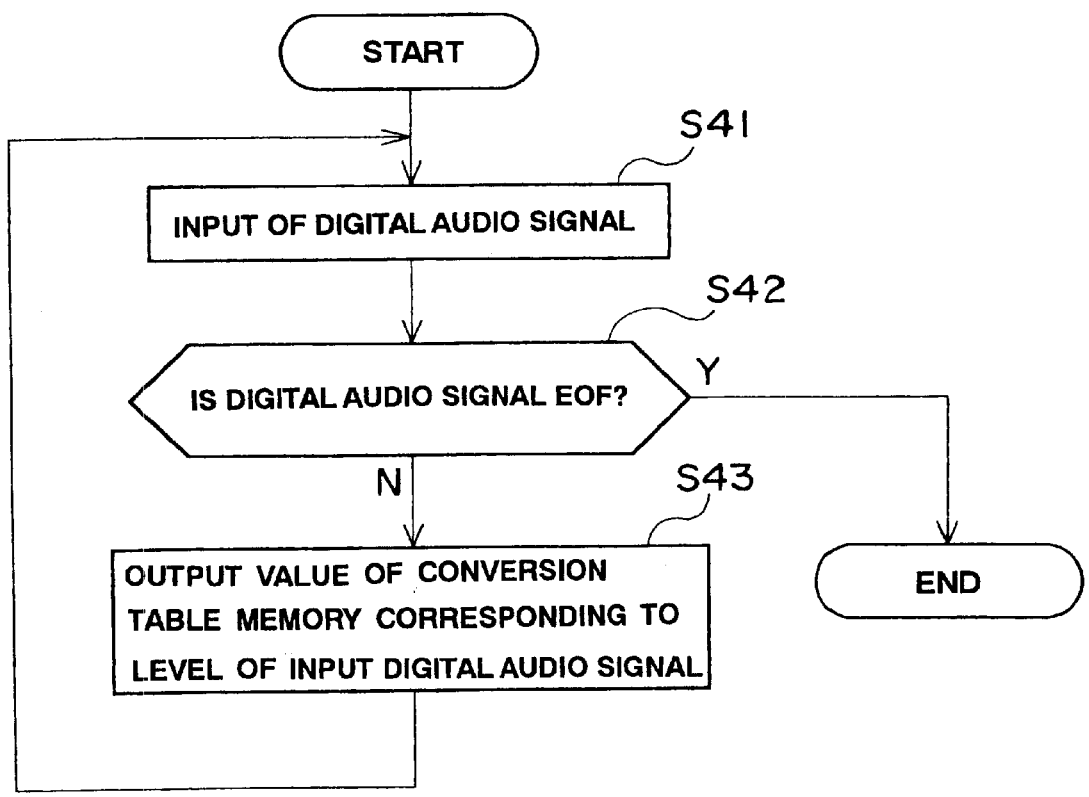
FIG. 19 is a flowchart illustrating the process operation of the distortion correcting device shown in FIG. 9.
Figure 20:
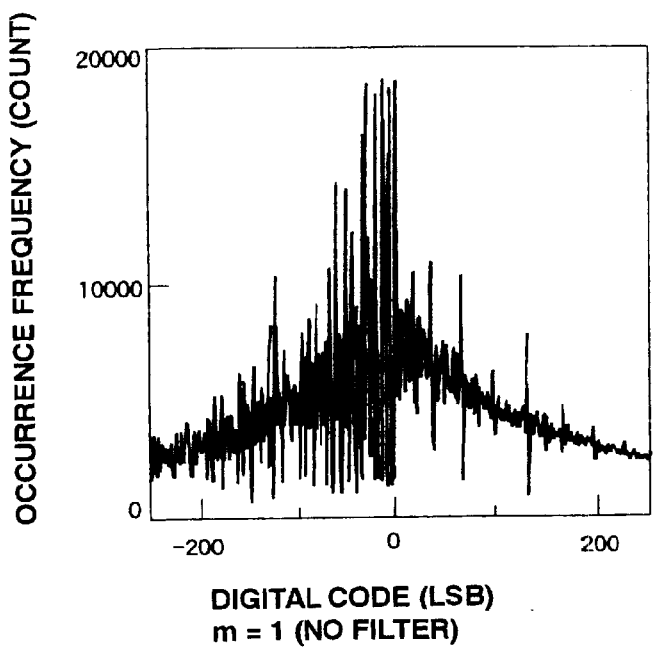
FIG. 20 shows the level distribution when the number of samples m of a moving average filter is 1.

Next, the process operation of the distortion correcting device of FIG. 9 is described with reference to the flowcharts in FIGS. 18 and 19. FIG. 18 is a flowchart showing an example operation of the conversion table calculation process (conversion error detection process) and FIG. 19 is a flowchart showing an example operation of the conversion process (conversion error correction process) on the digital audio data using the conversion table.

When the present device is used, the bit lengths of the input and output digital audio signals (music signal) may be arbitrary, although in this example, the bit lengths of the input and output music signals are respectively 13 bits and 16 bits. First, the switching means (such as a switch) 1 switch to the storage means 2 so that the calculation of the conversion table is performed by the storage means 2, the occurrence frequency detecting means 3, the normalizing means 34, and the conversion table calculating means 35.

Namely, the number of samples (number of measured samples) a of the digital audio signal for creating the histogram (level distribution) is set to a predetermined constant (step 31). Next, the digital audio signal (13 bit) stored in the storage medium 12 is sampled, and a samples are read and input to the storage means 2 (step S32). The music signal having a bit length of 13 bits, which is input and stored by the storage means 2 in this manner, is measured for the histogram (level distribution) by the occurrence frequency detecting means 3. In this case, the occurrence frequency detecting means 3, which include the histogram memory as described earlier, increment by 1 the value of the histogram memory at the address corresponding to the input data, and repeat this for a predetermined number of times (number of samples a) to create the histogram (level distribution) (steps S33 to S35). If the number of samples a for obtaining the level distribution of the digital audio signal is not large to a certain degree, the statistical accuracy of the obtained result is low, and if the number of samples a is larger than what is necessary, unnecessary processing time is required. Thus, it is necessary to set the value as close as possible to an ideal value. In other words, although it is preferable to have a large number of samples a for measuring the level distribution, a number larger than necessary requires extra processing time so a number of samples around 2,500,000 is appropriate.

Figure 21:
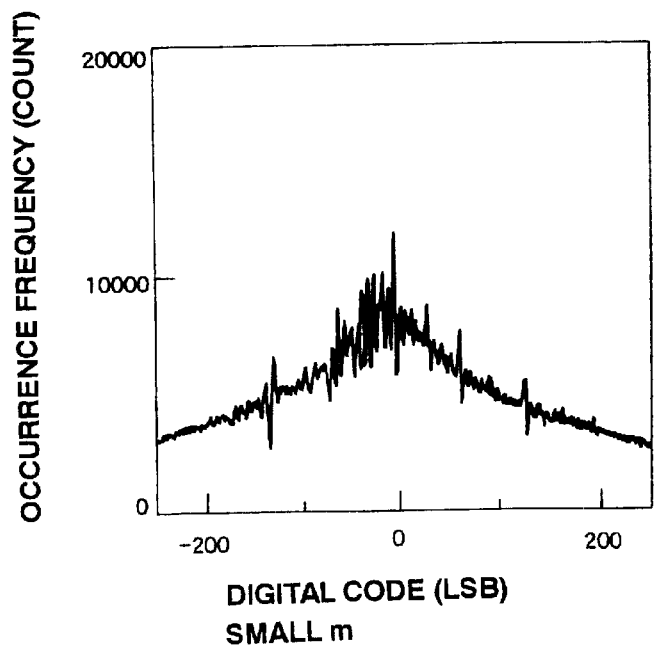
FIG. 21 shows the level distribution when the number of samples m of a moving average filter is small.
Figure 22:
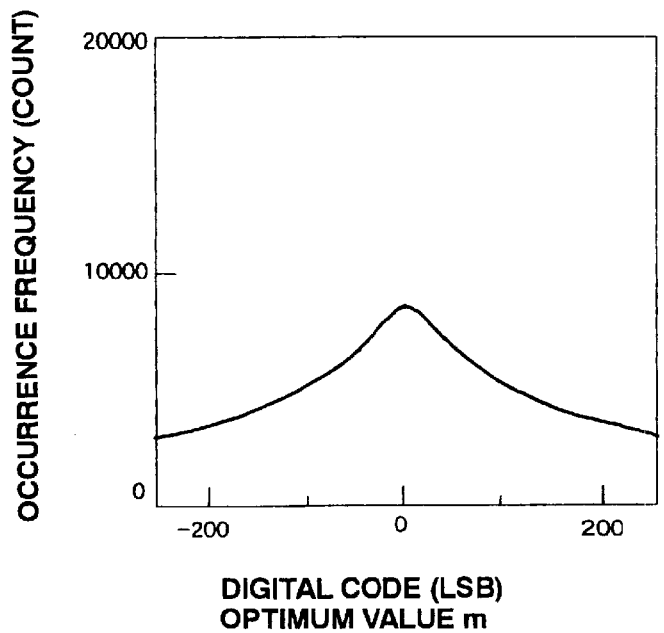
FIG. 22 shows the level distribution when the number of samples m of a moving average filter is an optimum value.
Figure 23:
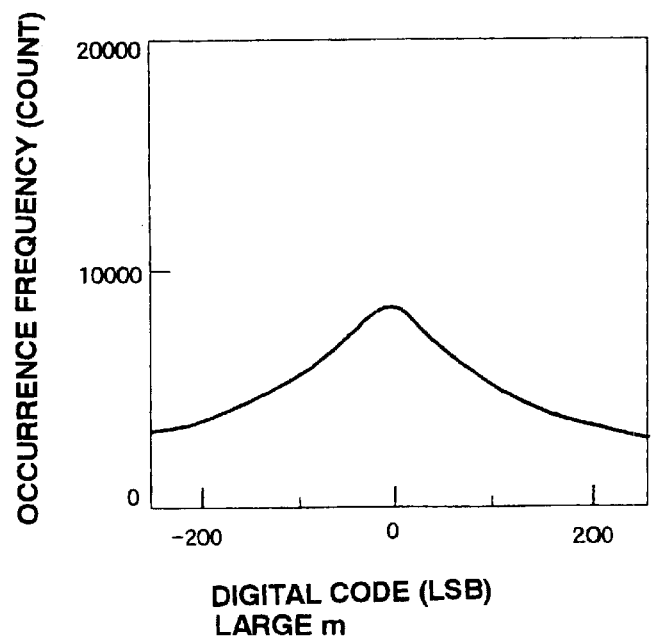
FIG. 23 shows the level distribution when the number of samples m of a moving average filter is large.

Next, the normalizing means 34 perform operations for formulas (2) and (3) on the histogram (level distribution) created by the occurrence frequency detecting means 3, and output the normalized value N(i) (step S36). In the low-pass filtering process of the normalizing means 34, the number of samples m of the moving average filter is preferably set to an optimum value. The level distributions are shown in FIGS. 20, 21, 22, and 23 for when the number of samples m is 1 (without filter), small, an optimum value, and large, respectively. When the number of samples m of the moving average filter is smaller than the optimum value, unevenness in the level distribution remains as shown in FIG. 21, and when the number of samples m of the moving average filter is larger than the optimum value, the values near 0 (LSB) decrease as shown in FIG. 23. As a result, the distortion in either case does not decrease as much as when m is the optimum value (namely, the case shown in FIG. 22).

Next, the conversion table calculating means 35 calculate the conversion table T(i) with performing the operation of formula (4) (accumulation process for normalized data N(i)) on the output of the normalizing means 34, namely, the normalized data N(i), and output it to the conversion table memory at a bit length of 16 bits (step 37).

Figure 24:
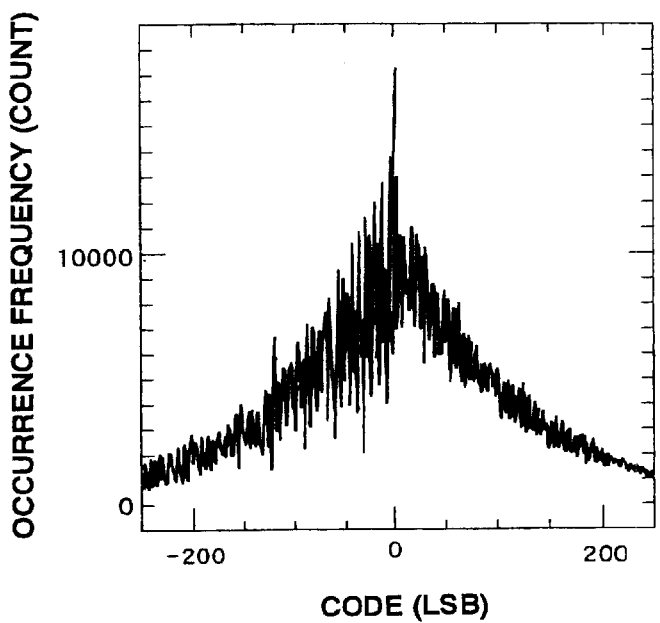
FIG. 24 shows the level distribution that was measured by the occurrence frequency detecting means in the distortion correcting device of FIG. 9.
Figure 25:
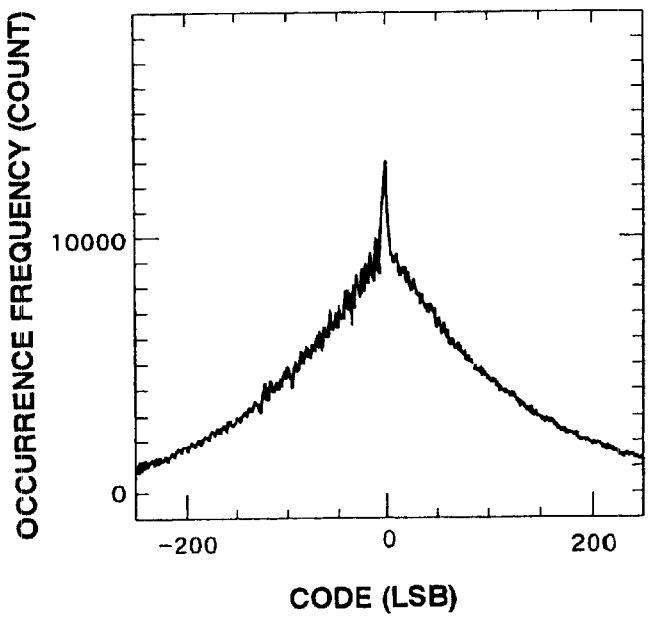
FIG. 25 shows the level distribution after smoothing by a low-pass filtering process on the level distribution shown in FIG. 24.
Figure 26:
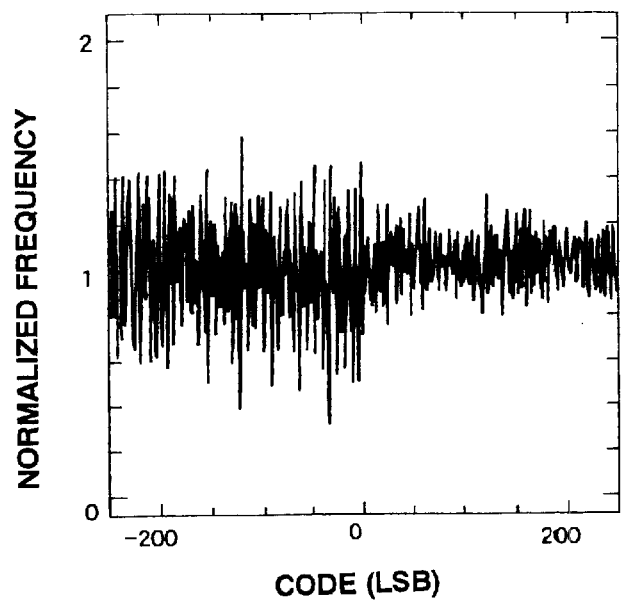
FIG. 26 shows normalized data N(i) (level distribution shown in FIG. 24 divided by the smoothed level distribution shown in FIG. 25) generated by the normalizing means.
Figure 27:
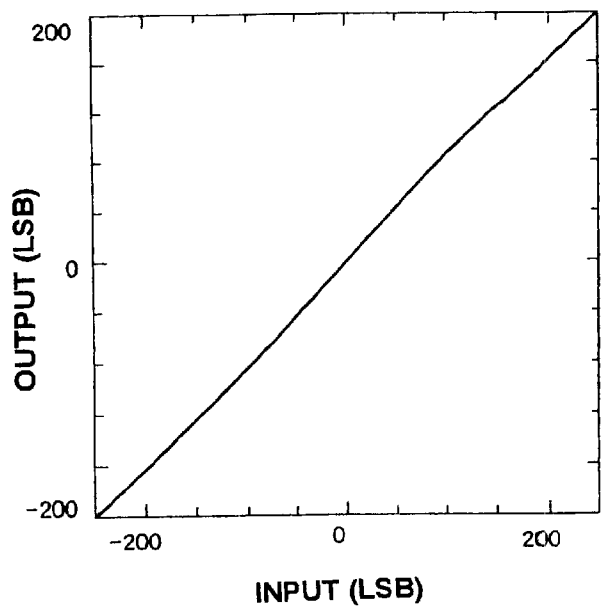
FIG. 27 shows the relationship between input and output in the conversion table created by accumulating the normalized data of FIG. 26, namely, the normalized frequency N(i).

The above-mentioned process is outlined in FIGS. 24 to 27. FIG. 24 shows the level distribution measured by the occurrence frequency detecting means 3, FIG. 25 shows the smoothed level distribution after applying the low-pass filtering process on the level distribution of FIG. 24, FIG. 26 shows data (dividing the level distribution shown in FIG. 24 by he smoothed level distribution shown in FIG. 25) N(i) normalized by the normalizing means 34, and FIG. 27 shows the conversion table created by accumulating the normalized data shown in FIG. 26, namely, the normalized frequency N(i), through formula (4).

After the conversion table T(i) is calculated in this manner and stored in the conversion table memory, switching means 1 switch to the data substituting means 36 so that the data substituting means 36 perform data conversion according to conversion table T(i) on the digital audio signal read from the storage medium 12. Namely, using level i of the digital audio signal read from the storage medium 12 as an address, the data substituting means 36 repeat for a predetermined number of times the operation for outputting the value T(i) stored at the corresponding address by accessing the conversion table memory.

More specifically, as shown in FIG. 19, for example, the switching means 1 successively cause the 13-bit digital audio signal that is read from the storage medium 12 to be input by the data substituting means 36 (step S41), and the data substituting means 36 repetitively perform the process (step S43) for outputting the value of the conversion table memory corresponding to the level of the input digital audio signal until the EOF (data indicating the end of data) is detected (step S42), and output the input digital audio signal after conversion to a 16-bit digital audio signal with reduced distortion. In this manner, the table-based conversion is performed by the data substituting means 36 so that the 13-bit music signal read from the storage medium 12 is converted into the 16-bit music signal in which the distortion based on the conversion error of the A/D converter 11 is reduced, and then output.

In this manner, when creating the conversion table T(i) from the histogram (level distribution) of the digital audio signal (music signal) at the distortion correcting device of FIG. 9, the unevenness in the level distribution due to the error in the conventional A/D converter is smoothed by the moving average filter to approximate the ideal level distribution for the case where there is no error in the A/D converter. Thus, for the distortion correcting device of FIG. 1, it is possible to substantially reduce the A/D conversion error by further correcting the unevenness in the occurrence frequency at or below the threshold.

In this manner, in the above-mentioned example configurations, if the A/D converter that was used during recording of the music source does not currently exist or the conversion characteristics have changed, the condition of the original music source without A/D conversion error is estimated from the old music source and the input data is substituted with data estimated to be correct so that the music source that includes the A/D conversion error can be corrected.

In the example configuration of FIG. 9, the A/D conversion error was estimated using the music signal (digital audio signal). However, if the A/D converter that was used during recording of the music source exists without any change in conversion characteristics, the A/D conversion error can be determined by inputting a linear count-up signal to the A/D converter and comparing the input signal and output signal of the A/D converter. This sort of correction using the linear count-up signal can be performed in the following manner.

Figure 28:
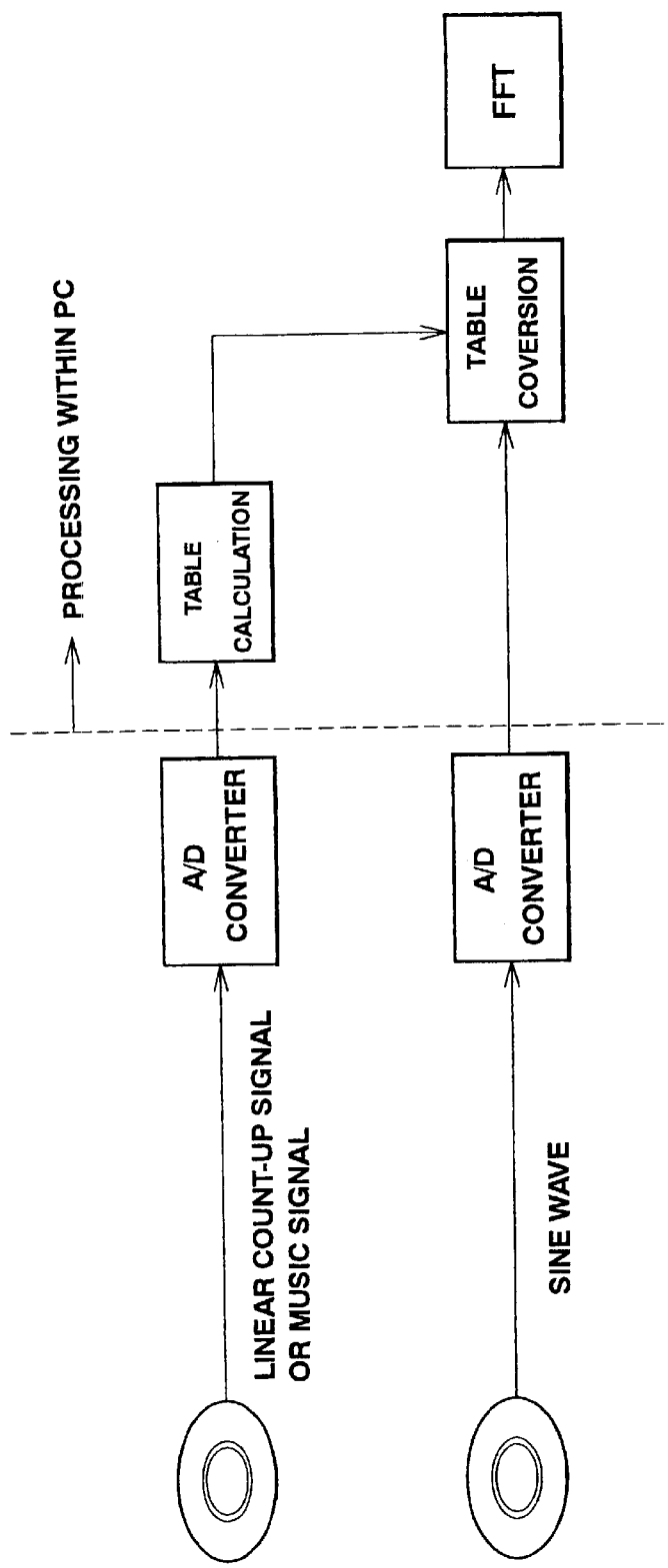
FIG. 28 illustrates the correction process using the linear count-up signal.
Figure 29:
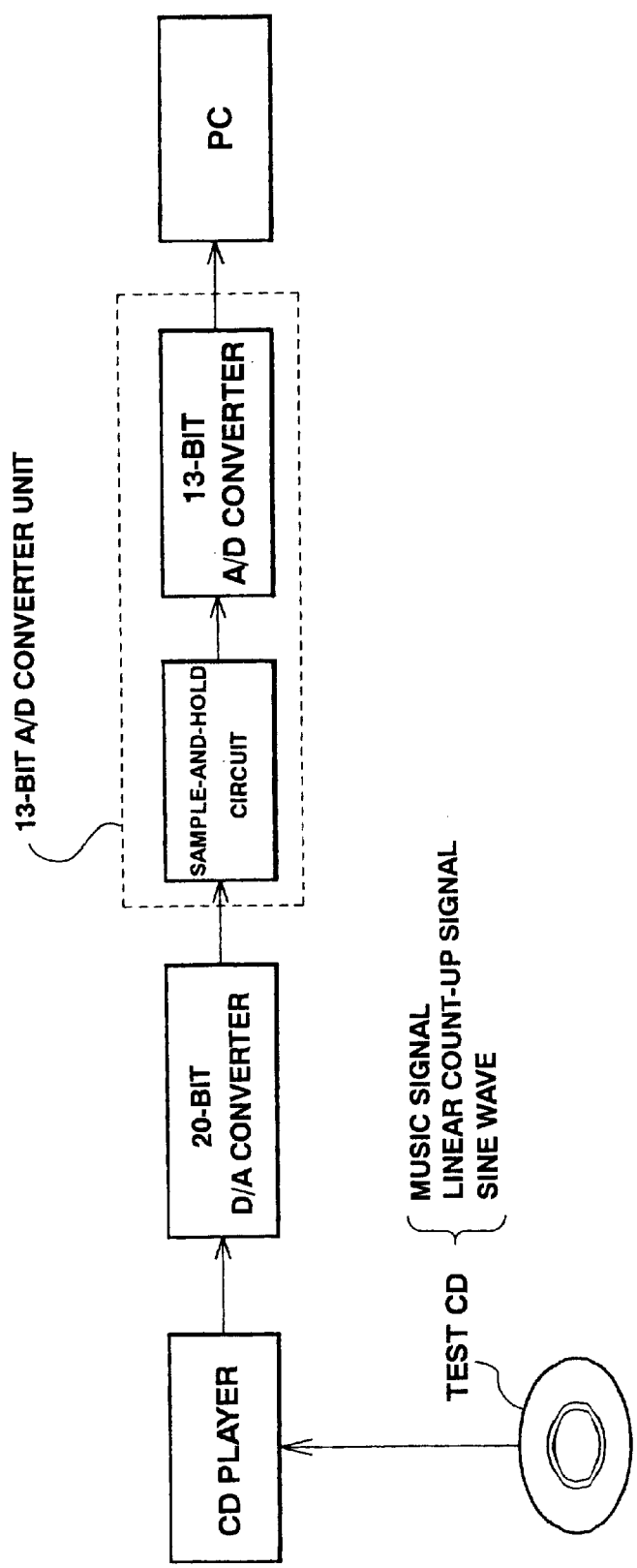
FIG. 29 illustrates the correction process using the linear count-up signal.

Namely, for example, with the old A/D converter measurement system (such as the system shown in FIG. 29) as shown in FIG. 28, the linear count-up signal and sine wave are captured by the PC (Personal Computer), the conversion table is calculated from the level distribution of the linear count-up signal, an FFT (fast Fourier transform) is performed for the table-based conversion on the sine wave, and changes in distortion are checked. The conversion table calculation process and the table-based conversion process may be performed, for example, within a PC running a program written in the C language, and the FFT may be performed using commercially available signal processing software.

The conversion table calculation process can now be performed as shown in the following example method. Namely, suppose the occurrence frequency of the digital code i $(-2^{n-1}23 \; i \leq 2^{n-1}-1)$ is h(i) when the number of quantization bits is n and the total number of samples is sc, and the normalized occurrence frequency is N(i). To facilitate the calculation of the table, the normalization of h(i) is performed so that N(i)=1.0 when h(i)=sc/$2^n$ as shown in the following formula.

$$N(i)=(2^n/sc) \cdot h(i) \tag{6}$$

Next, N(i) is estimated as shown in formula (4), and table T(i) is obtained.

Figure 30:
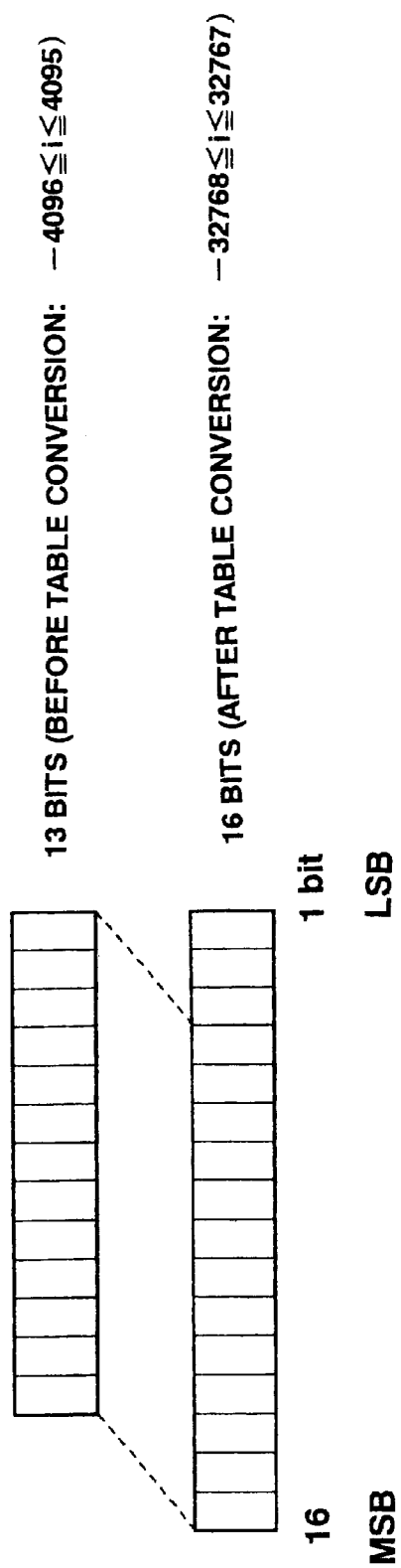
FIG. 30 shows a relationship between the data (13 bits) before table-based conversion and the data (16 bits) after table-based conversion.

In the actual process, the data (13 bits) before table-based conversion and the data (16 bits) after table-based conversion assume the relationship shown in FIG. 30 so that table value T(i) is multiplied by $2^3$=8 to yield 16 bits.

In this manner, the correction using the linear count-up signal is effective, for example, when the music signal currently recorded in 16 bits is converted into a music signal having 24 bits or more in the future. Furthermore, the linear count-up signal may be recorded on the storage medium during music signal recording, and in this case, the distortion based on the conversion error can be reduced with a higher accuracy even if the A/D converter does not currently exist.

In the process described above with reference to FIG. 1 or FIG. 9, after the switching means 1 output the digital audio signal from the storage medium 12 to the storage means 2 for the process to detect the conversion error, the same digital audio signal is again read from the storage medium 12 and output to the digital signal processing means 6 or to the data substituting means 36. The present invention, however, is not limited to this process. For example, the configuration may be designed so that after all the digital audio signals for which distortion accompanying the conversion error is to be reduced are stored in the storage means 2 through the switching means 1, the output through the switching means 1 from the storage means 2 is directly supplied to the digital signal processing means 6 or to the data substituting means 36.

Furthermore, for example, the configuration may be designed with delay means in a stage prior to the digital signal processing means 6 or the data substituting means 36 so that the switching means 1 supply the digital audio signal read from the storage medium 12 simultaneously to the storage means 2 and to the delay means, and while the conversion error is being detected, the digital audio signal to be corrected is delayed by the delay means so that the correction output process is possible in real time by the digital signal processing means 6 or the data substituting means 36.

Furthermore, if it is not necessary to output in real time the digital audio signal, in which the distortion accompanying the conversion error was reduced, such as in the case where the distortion-reduced digital audio signal is to be stored in another storage device, the configuration may be designed so that a hard disk having a fast data transfer rate is used for the storage means 2 and the output of the storage means 2 is directly input via the switching means 1 by the digital signal processing means 6 or the data substituting means 36.

Although the digital audio signal was recorded on the storage medium 12, such as a compact disc, and the digital audio signal was read from the storage medium 12 in the example above, the digital audio signal to be corrected may also be stored in a storage device comprising semiconductor memory, such as ROM or RAM, and in this case, the digital audio signal is read from this storage device. Also, in this case, the storage device may be controlled by including the function of the storage means 2 in the storage device itself, and furthermore, at this time, the output from the storage device may be input directly by the occurrence frequency detecting means 3.

In other words, in the present invention, the term "storage means" is intended to have a broad definition. Thus, "storage means" may signify not only the storage means 2 of FIG. 1 or FIG. 9 but also the storage medium 12, ROM, RAM, and so forth.

INDUSTRIAL APPLICABILITY

As described above, the distortion detecting device, the distortion correcting device, and the distortion correcting method relating to the present invention can improve the quality of digital audio signals generated from analog audio signals by A/D converters, such as the music recorded on DAT and CD media. In other words, a high-quality digital audio signal corrected for conversion error can be generated from a digital audio signal containing conversion error by detecting and then further correcting the distortion accompanying the conversion error generated at the time of A/D conversion. By reproducing this digital audio signal, high-quality music can be provided to the listener from the digital audio signal that was generated from conventional A/D converters having poor conversion accuracy.

What is claimed is:

1. A digital audio signal distortion correcting device comprising:

storage means (2) for storing a digital audio signal converted to code by an analog/digital converter;

occurrence frequency detecting means (3) for extracting a plurality of samples from said digital audio signal stored in said storage means (2) and counting an occurrence frequency of said samples for every code expressing a quantization level of the samples to obtain a level distribution;

normalizing means (34) for generating, by applying a low-pass filtering process on the original level distribution detected by said occurrence frequency detecting means (3), an ideal level distribution approximating an ideal case where said analog/digital converter has no error, dividing said original level distribution by said ideal level distribution, and setting the division result thereof as a normalized level distribution;

conversion table calculating means (35) for calculating, based on said normalized level distribution, a conversion table in which data bit lengths are extended to make a correction with respect to a conversion error of said analog/digital converter for all of said quantization levels of said digital audio signal; and data substituting means (36) for substituting said quantization level of said digital audio signal with level data according to said conversion table for output.

2. A digital audio signal distortion correcting method comprising the steps of:

estimating a conversion error for an analog/digital converter that is used, from a level distribution of a digital audio signal recorded using the analog/digital converter;

calculating, based on the estimated conversion error, a conversion table in which data bit lengths are extended to make a correction with respect to the conversion error of said analog/digital converter for all quantization levels of said digital audio signal; and performing a conversion process using said conversion table on said digital audio signal to correct a distortion generated by the conversion error of said analog/digital converter while extending bits.

3. A distortion correcting method comprising the steps of:

collecting a predetermined number of samples from a digital audio signal recorded using an analog/digital converter to obtain a level distribution of the concerned samples;

applying a low-pass filtering process on said level distribution to generate an ideal level distribution approximating an ideal case where the analog/digital converter has no error;

dividing said level distribution, before said low-pass filtering process was applied, by said level distribution, and accumulating the divided result to set the divided result thereof as a normalized level distribution, carrying out accumulation based on the normalized level distribution to calculate a conversion table in which data bit lengths are extended to make a correction with respect to a conversion error of said analog/digital converter for all quantization levels of said digital audio signal; and substituting the quantization level of the digital audio signal with the level data according to the conversion table for output.

* * * * *